(12) United States Patent
Yilmaz

(10) Patent No.: US 10,998,438 B2
(45) Date of Patent: May 4, 2021

(54) SELF-ALIGNED TRENCH MOSFET STRUCTURES AND METHODS

(71) Applicant: Hamza Yilmaz, Gilroy, CA (US)

(72) Inventor: Hamza Yilmaz, Gilroy, CA (US)

(73) Assignee: IPOWER SEMICONDUCTOR, Gilroy, CA (US)

( * ) Notice: Subject to any disclaimer, the term of this patent is extended or adjusted under 35 U.S.C. 154(b) by 0 days.

(21) Appl. No.: 16/290,834

(22) Filed: Mar. 1, 2019

(65) Prior Publication Data

US 2019/0273157 A1 Sep. 5, 2019

Related U.S. Application Data

(60) Provisional application No. 62/637,274, filed on Mar. 1, 2018.

(51) Int. Cl.

| | |
|---|---|
| H01L 29/76 | (2006.01) |
| H01L 29/78 | (2006.01) |
| H01L 29/49 | (2006.01) |
| H01L 29/417 | (2006.01) |
| H01L 21/308 | (2006.01) |
| H01L 29/40 | (2006.01) |
| H01L 29/66 | (2006.01) |
| H01L 29/10 | (2006.01) |
| H01L 29/06 | (2006.01) |
| H01L 29/423 | (2006.01) |

(52) U.S. Cl.
CPC ...... *H01L 29/7813* (2013.01); *H01L 21/3086* (2013.01); *H01L 29/0696* (2013.01); *H01L 29/1095* (2013.01); *H01L 29/407* (2013.01); *H01L 29/41741* (2013.01); *H01L 29/4236* (2013.01); *H01L 29/495* (2013.01); *H01L 29/4966* (2013.01); *H01L 29/66734* (2013.01); *H01L 29/7806* (2013.01)

(58) Field of Classification Search
CPC ............. H01L 29/7813; H01L 21/3086; H01L 29/0696; H01L 29/1095; H01L 29/407
See application file for complete search history.

(56) References Cited

U.S. PATENT DOCUMENTS

| | | | |
|---|---|---|---|
| 5,219,777 | A | 6/1993 | Kang |
| 8,816,431 | B2 | 8/2014 | Bowers |
| 8,847,310 | B1 | 9/2014 | Korec |
| 9,224,853 | B2 | 12/2015 | Pan |
| 10,056,461 | B2 | 8/2018 | Lui et al. |
| 2002/0036319 | A1 | 3/2002 | Baliga |
| 2009/0096018 | A1 | 4/2009 | Izumi |

(Continued)

OTHER PUBLICATIONS

PCT, International Search Report and Written Opinion of the International Searching Authority for International Application No. PCT/US19/32757, dated Aug. 16 2019, 9 pages.

(Continued)

*Primary Examiner* — Samuel A Gebremariam
(74) *Attorney, Agent, or Firm* — Halit N. Yakupoglu

(57) ABSTRACT

A MOSFET device structure is formed on a semiconductor wafer. The structure includes an array of plurality of MOS gate trenches and self-aligned p+ contact trenches that are formed in a p body region. Trench depth of MOS gate trenches are deeper than the self-aligned p+ contact trenches. P doped shield regions are formed under each MOS gate trench.

21 Claims, 45 Drawing Sheets

(56) References Cited

U.S. PATENT DOCUMENTS

| | | |
|---|---|---|
| 2010/0190307 A1 | 7/2010 | Lee et al. |
| 2011/0254088 A1* | 10/2011 | Darwish ............ H01L 29/66727 257/340 |
| 2012/0248530 A1 | 10/2012 | Lui et al. |
| 2016/0126348 A1* | 5/2016 | Deng ................ H01L 29/41766 438/270 |
| 2016/0172482 A1 | 6/2016 | Bobde et al. |
| 2017/0330964 A1 | 11/2017 | Siemieniec et al. |

OTHER PUBLICATIONS

PCT, International Search Report and Written Opinion of the International Searching Authority for International Application No. PCT/US2019/020441, dated May 23, 2019, 8 pages.

\* cited by examiner

SELF-ALIGNED TRENCH MOSFET STRUCTURES AND METHODS

CROSS REFERENCE TO RELATED APPLICATION

This application relates to and claims priority from U.S. provisional patent application Ser. No. 62/637,274 filed on Mar. 1, 2018, which is expressly incorporated by reference herein in its entirety.

BACKGROUND

Field of the Invention

The present invention relates to semiconductor devices, more particularly, to device structures and methods of forming trench metal oxide semiconductor field effect transistor (MOSFET) devices.

Description of the Related Art

In power metal oxide semiconductor field effect transistor (MOSFET) devices, as the resistance per square area is kept decreasing due to the availability of new structures, advanced process techniques and tools, die sizes for MOSFET products are also getting smaller and smaller. There are several challenges to be addressed in advanced trench MOSFET products with smaller die sizes, for example: (1) increasing thermal resistance of the smaller die and, (2) increasing robustness of the MOSFETs to handle much higher current density under unclamped inductive, high dv/dt and diode recovery mode of operations compared to low performing larger die area type power MOSFETs.

Manufacturing thinner dies and improved power device packaging can address the thermal resistance related issues in power MOSFET devices. Improving the robustness of power MOSFET devices in smaller dies includes, for example, (1) providing structures and processes to localize breakdown in the middle of the MOSFET body, (2) ensuring device avalanche breakdown to occur in the active device cells (MOSFETs) rather than the termination areas, (3) keeping extremely low p body to source shorting resistance to prevent turn on of parasitic NPN bipolar transistor of the MOSFET. Mask misalignment of a non-self-aligned p body contact to trench causes an increased shorting resistance between the p body and the n+ source of the MOSFET. The present invention can prevent p body contact to trench thus keeps p body to source shorting resistance minimum.

SUMMARY

An aspect of the present invention includes a MOSFET device, including: a semiconductor layer having a first type conductivity overlying a semiconductor substrate, the semiconductor layer having a front surface; an array of a plurality gate trenches and contact trenches formed in an alternating fashion disposed in an active region of the front surface extending orthogonally from the front surface toward the semiconductor substrate, each gate trench defining a first depth and a first width and each contact trench defining a second depth and a second width, and wherein the first depth and the first width are greater than the second depth and the second width, respectively; wherein each gate trench includes a conductive structure of the first type conductivity, the conductive structure in each gate trench being insulated by an insulation layer, and wherein each contact trench is formed within a first doped contact region, having a second type conductivity, extending between the adjacent gate trenches and includes a contact structure connected to a source electrode, wherein the depth of the first doped contact region is less than the first depth and greater than the second depth; and a second doped contact region of the second type conductivity located at least partially within the first doped contact region and under each contact trench, the second doped contact region being in electrical contact with the a source electrode via the contact structure in the contact trench, wherein the second doped contact region has a higher second type dopant concentration than the first doped contact region, and wherein the second doped contact region is located equal distance away from the gate trenches located at both sides of the second contact region.

Another aspect of the present invention includes a MOSFET device, including: a semiconductor layer having a first type conductivity overlying a semiconductor substrate, the semiconductor layer having a front surface; an array of plurality of MOS gate trenches and contact trenches formed in an alternating fashion disposed in an active region of the front surface extending orthogonally from the front surface toward the semiconductor substrate, wherein each MOS gate trench defining a first depth and a first width and each contact trench defining a second depth and a second width, and wherein the first depth and the first width are greater than the second depth and the second width, respectively; a first doped contact region, having a second type of conductivity, extending between the MOS gate trenches of the array, each contact trench being disposed within the first doped contact region, wherein the first doped contact region has a T-shape including a horizontal section extending parallel to the front surface and a vertical section extending orthogonally from a central part of the horizontal section, wherein the depth of the first doped contact region is less than the first depth and greater than the second depth; wherein each MOS gate trench includes a conductive structure of the first type conductivity, the conductive structure in the MOS gate trench being insulated by an insulation layer, and wherein each contact trench includes a contact structure connected to a source electrode; and a second doped contact region of the second type conductivity located within the first doped contact region and under the contact trench, a first portion of the second contact region being in the horizontal section of the first doped contact region and a second portion of the second contact region being in the vertical section of the first doped contact region, wherein the second doped contact region is in electrical contact with a source electrode via the contact structure in the contact trench, and wherein the second doped contact region has a higher second type dopant concentration than the first doped contact region, and wherein the second doped contact region is located equal distance away from the MOS gate trenches located at both sides of the second contact region.

Another aspect of the present invention includes a method for forming a MOSFET device, including: providing a semiconductor layer having a first type conductivity overlying a semiconductor substrate, the semiconductor layer having a front surface; forming an array of a plurality gate trenches and contact trenches disposed in an alternating fashion in an active region of the front surface extending orthogonally from the front surface toward the semiconductor substrate, wherein each gate trench defining a first depth and a first width and each contact trench defining a second depth and a second width, and wherein the first depth and the first width are greater than the second depth and the second width, respectively; forming in each gate trench a first conductive structure and a second conductive structure of the first type conductivity, wherein the first conductive structure is electrically insulated from the second conductive structure in the gate trench by an insulation layer; forming a first doped contact region by implanting dopants with a second type conductivity to the semiconductor layer, wherein the first doped contact region extends between the adjacent gate trenches in the array, wherein the depth of the first doped contact region is less than the first depth and greater than the second depth; forming a second doped contact region of the second type conductivity located at least partially within the first doped contact region and under the contact trench by implanting dopants with a second type conductivity through a bottom wall of each gate trench, wherein the second doped contact region has a higher second type conductivity dopant concentration than the first doped contact region, and wherein the second doped contact region is located equal distance away from the gate trenches located at both sides of the second contact region; and forming a contact structure within each contact trench, each contact structure is in electrical connection with a source electrode, wherein the second doped contact region is in electrical contact with the source electrode via the contact structures.

Yet another aspect of the present invention includes a method for forming a MOSFET device, including: providing a semiconductor layer having a first type conductivity overlying a semiconductor substrate, the semiconductor layer having a front surface; forming an array of a plurality gate trenches and contact trenches disposed in an alternating fashion in an active region of the front surface extending orthogonally from the front surface toward the semiconductor substrate, wherein each gate trench defining a first depth and a first width and each contact trench defining a second depth and a second width, and wherein the first depth and the first width are greater than the second depth and the second width, respectively; forming in each gate trench a first conductive structure and a second conductive structure of the first type conductivity, wherein the first conductive structure is electrically insulated from the second conductive structure in each gate trench by an insulation layer; forming a first doped contact region, by implanting dopants with a second type of conductivity, extending between the gate trenches of the array, each contact trench being disposed within the first doped contact region, wherein the first doped contact region has a T-shape body including a horizontal section extending parallel to the front surface and a vertical section extending orthogonally from a central part of the horizontal section, wherein the depth of the first doped contact region is less than the first depth and greater than the second depth; forming a second doped contact region of the second type conductivity located within the first doped contact region and under the contact trench by implanting dopants with a second type conductivity, a first portion of the second contact region being in the horizontal section of first doped contact region and a second portion of the second contact region being in the vertical section of the first doped contact region, and wherein the second doped contact region has a higher second type dopant concentration than the first doped contact region, and wherein the second doped contact region is located equal distance away from the gate trenches located at both sides of the second contact region; and forming a contact structure within each contact trench, each contact structure is in electrical connection with a source electrode, wherein the second doped contact region is in electrical contact with the source electrode via the contact structures.

DETAILED DESCRIPTION

Embodiments of the present invention concern with robustness in power MOSFET devices and provide a method to improve robustness forming self-aligned p+ body contact region(s) with respect to trench gate(s). In this disclosure, forming, making or manufacturing are used interchangeably. The region, area and layer are also used interchangeably as well.

In one embodiment, the present invention provides a trench MOSFET device comprising a plurality of metal-oxide semiconductor (MOS) gate trenches and a plurality of p body contact trenches. The depth and the width of the p body contact trenches may be smaller than the depth and the width of the MOS gate trenches. The MOS gate trenches may have an oxide layer in them as gate insulator and a conductor including n+ poly silicon forming a MOSFET gate region. The p body contact trenches are disposed inside a p body region adjacent the MOS gate trenches. A heavily doped p+ body region located at the bottom of the p body contact trenches may be in electrical contact with a source electrode of the MOSFET device via a portion of a contact material, or contact electrode, e.g., a metal filling, of the contact trench. In this MOSFET structure, the distances between the p+ body region and the MOS gate trenches located at either side of the p body contact trench are equal. Typical dimensions, for MOS gate trenches and p body contact trenches for an exemplary 100V trench MOSFET device can be seen in FIG. 3C. In this disclosure, in double poly silicon or shielded structures, n+ poly silicon at the trench bottom is called poly 1 or first poly silicon and n+ poly silicon filling the upper part of the MOS gate trenches is called poly 2 or second poly silicon for clarity purposes.

Figure 1A:
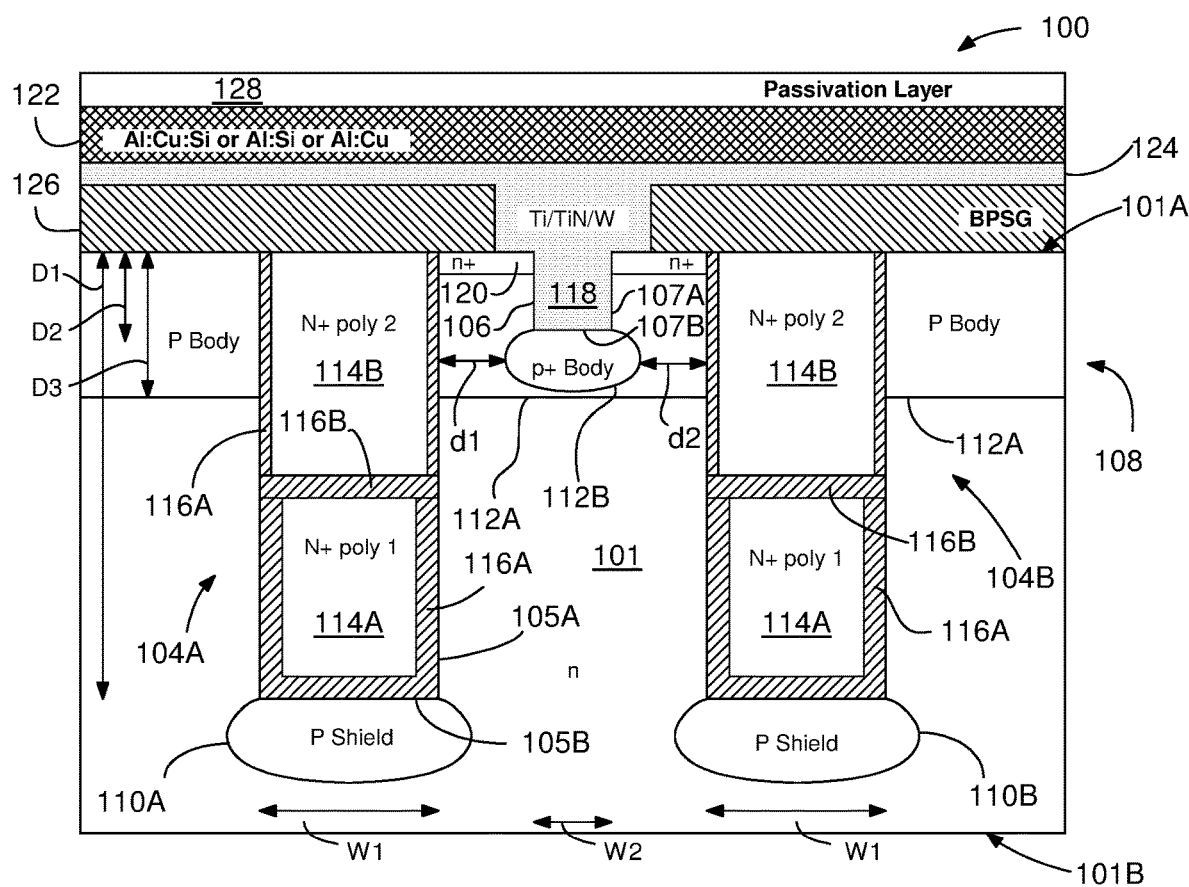
FIG. 1A illustrates a double poly Si with p shield trench MOSFET structure with active device region.
Figure 1B:
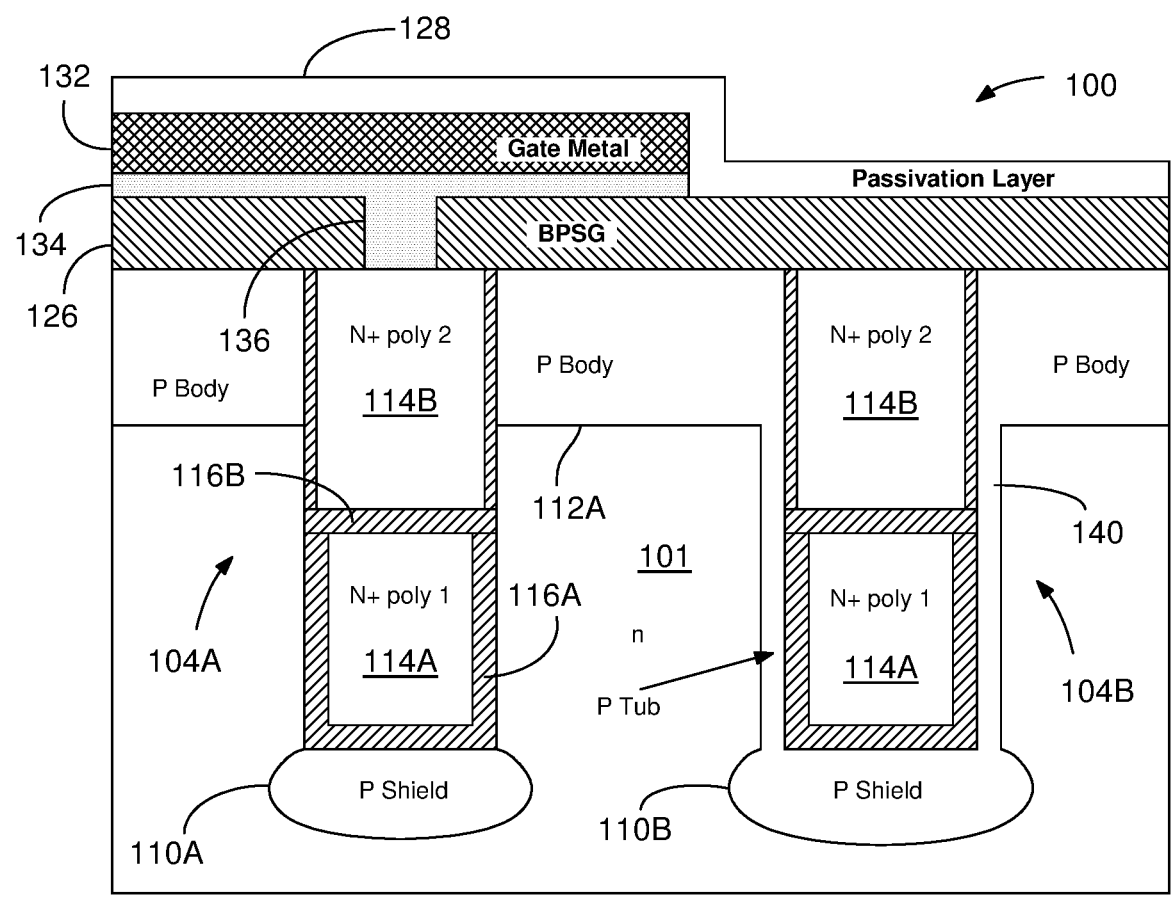
FIG. 1B illustrates a double poly with p shield trench MOSFET structure with gate contact and gate metal region.
Figure 1C:
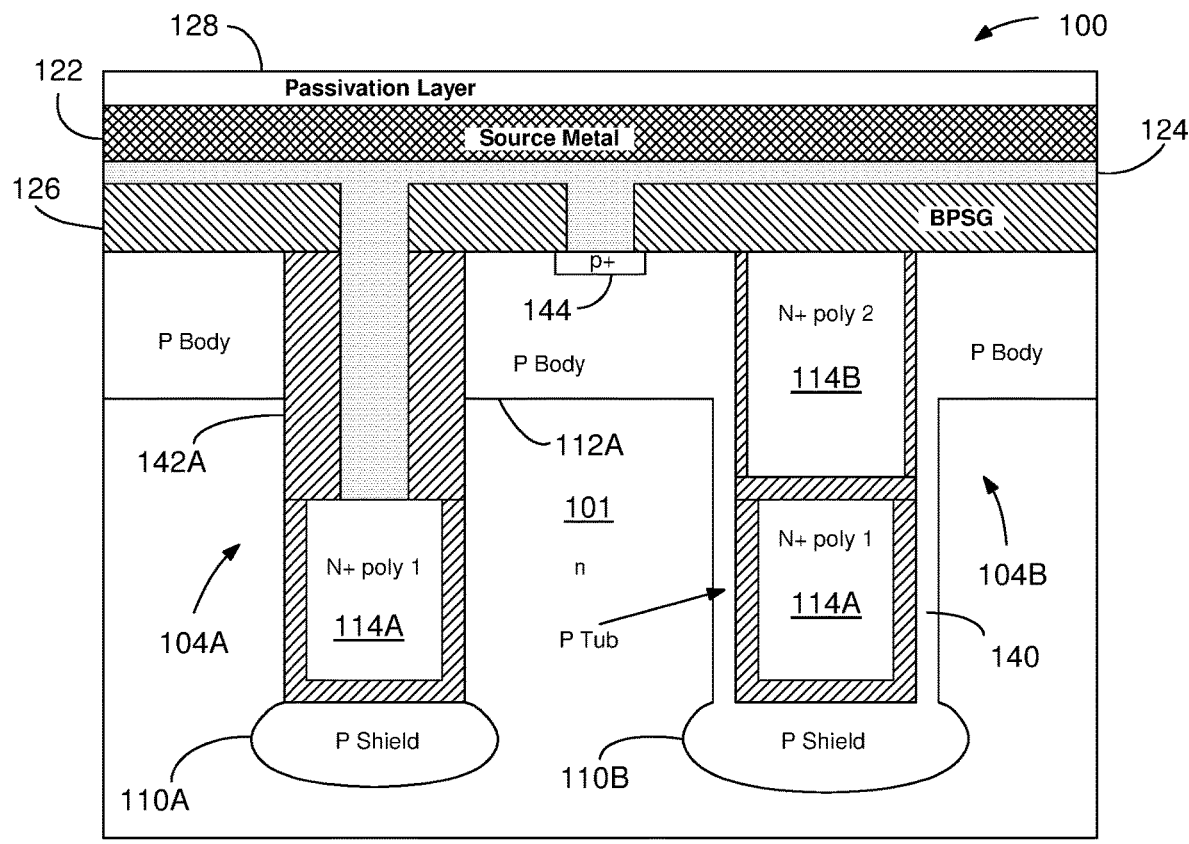
FIG. 1C illustrates a double poly with p shield trench MOSFET structure with poly 1 contact region and p shield shorting to source via p tub.
Figure 1D:
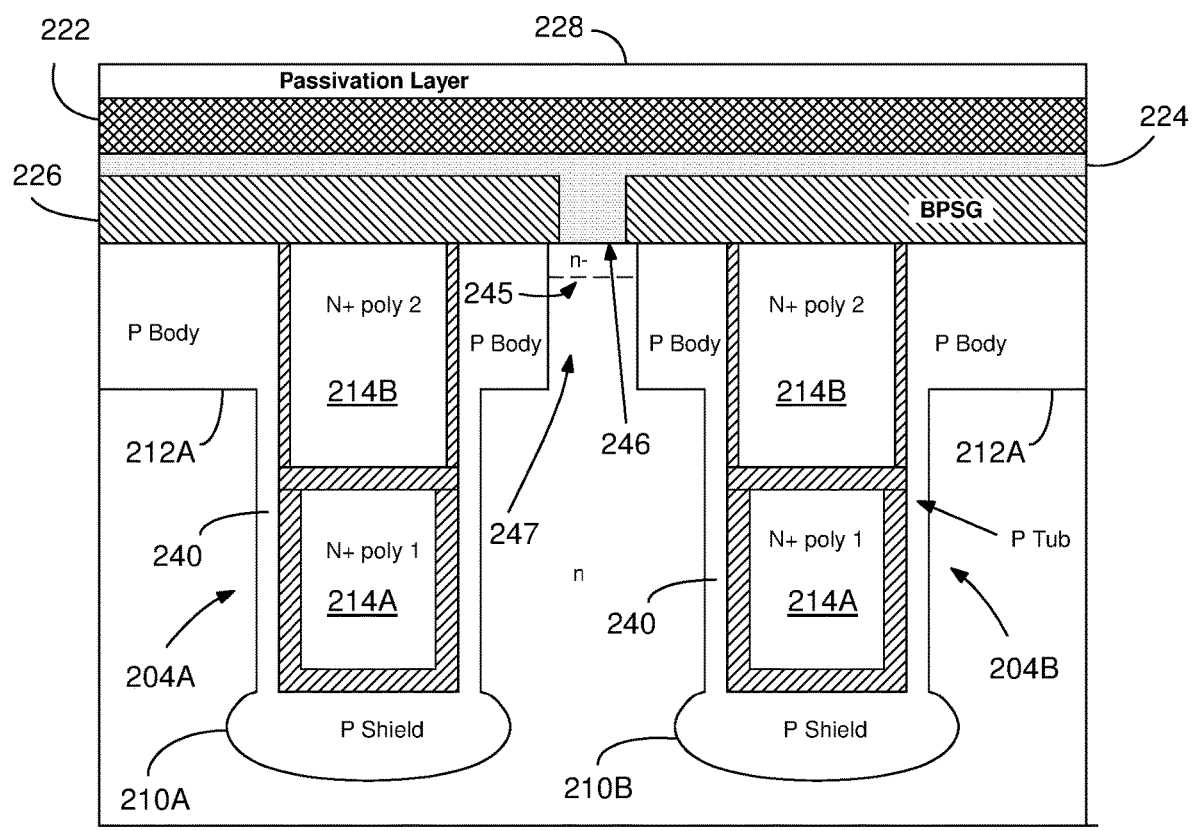
FIG. 1D illustrates a double poly with p shield trench MOSFET structure with integrated Schottky diode region.
Figure 1E:
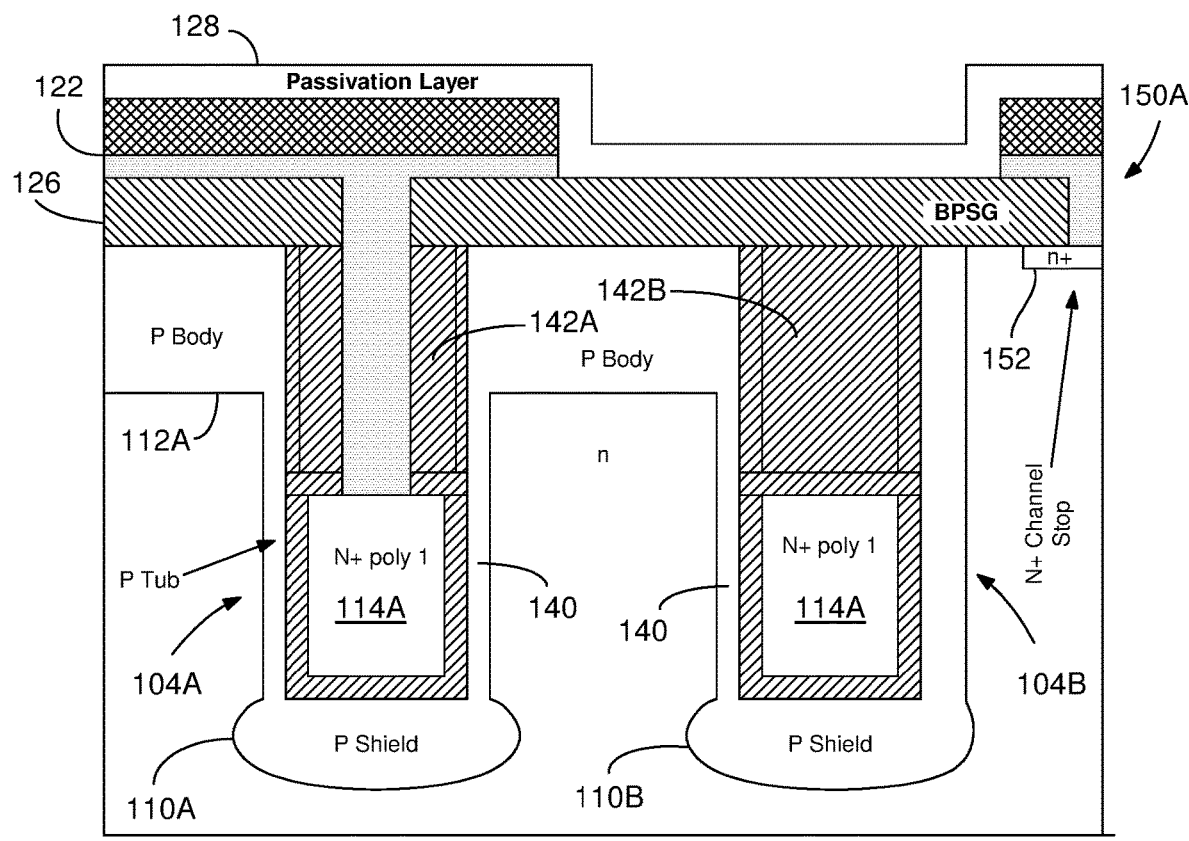
FIG. 1E illustrates a double poly with p shield trench MOSFET structure with edge termination with p tub and BPSG filled trench region.
Figure 1F:
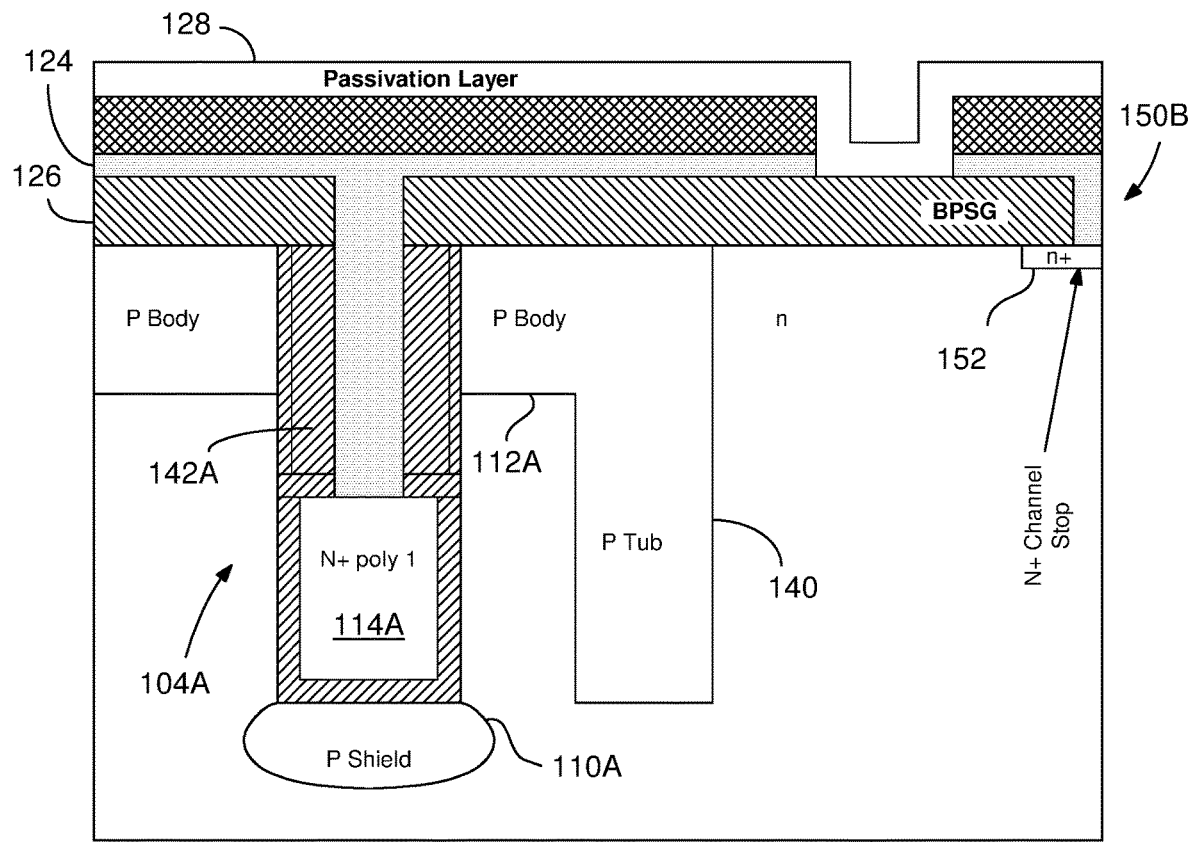
FIG. 1F illustrates a double poly with p shield trench MOSFET structure with another edge termination region using p tub.
Figure 1G:
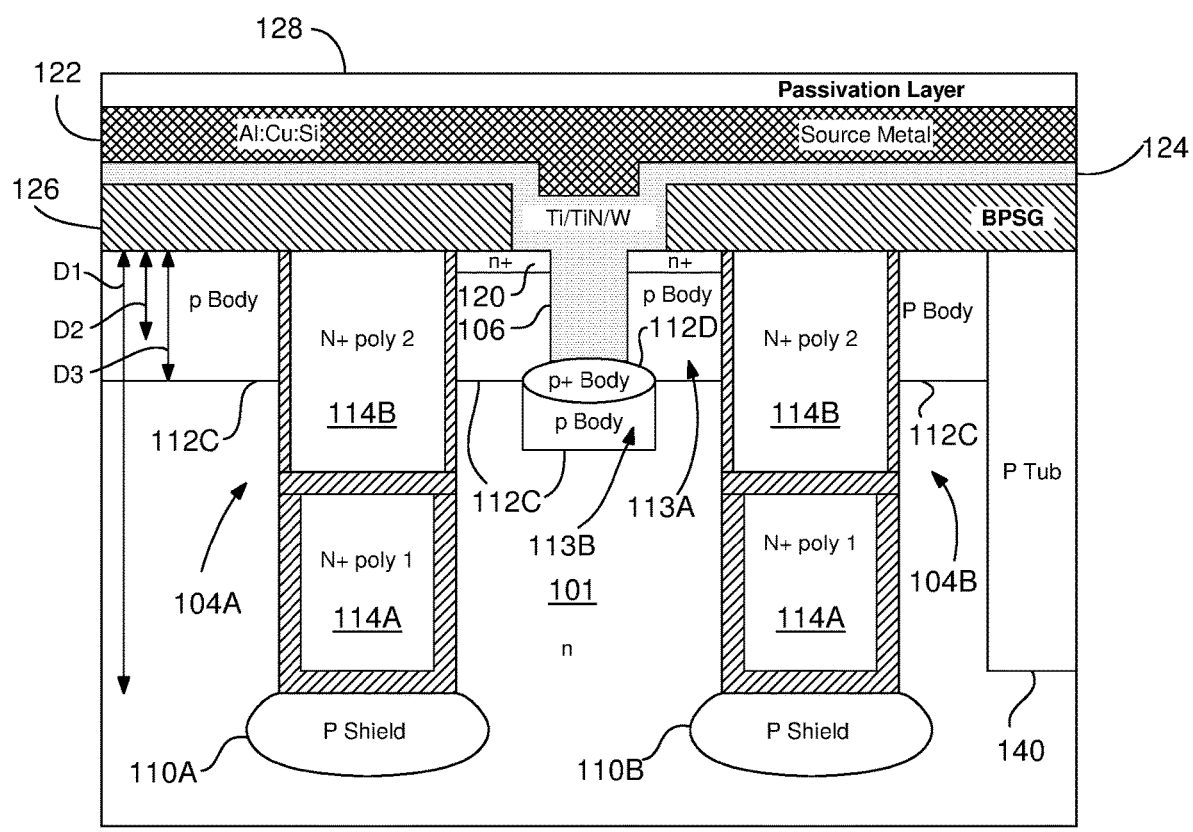
FIG. 1G illustrates a double poly with p shield trench MOSFET structure with T-shape body.
Figure 1H:
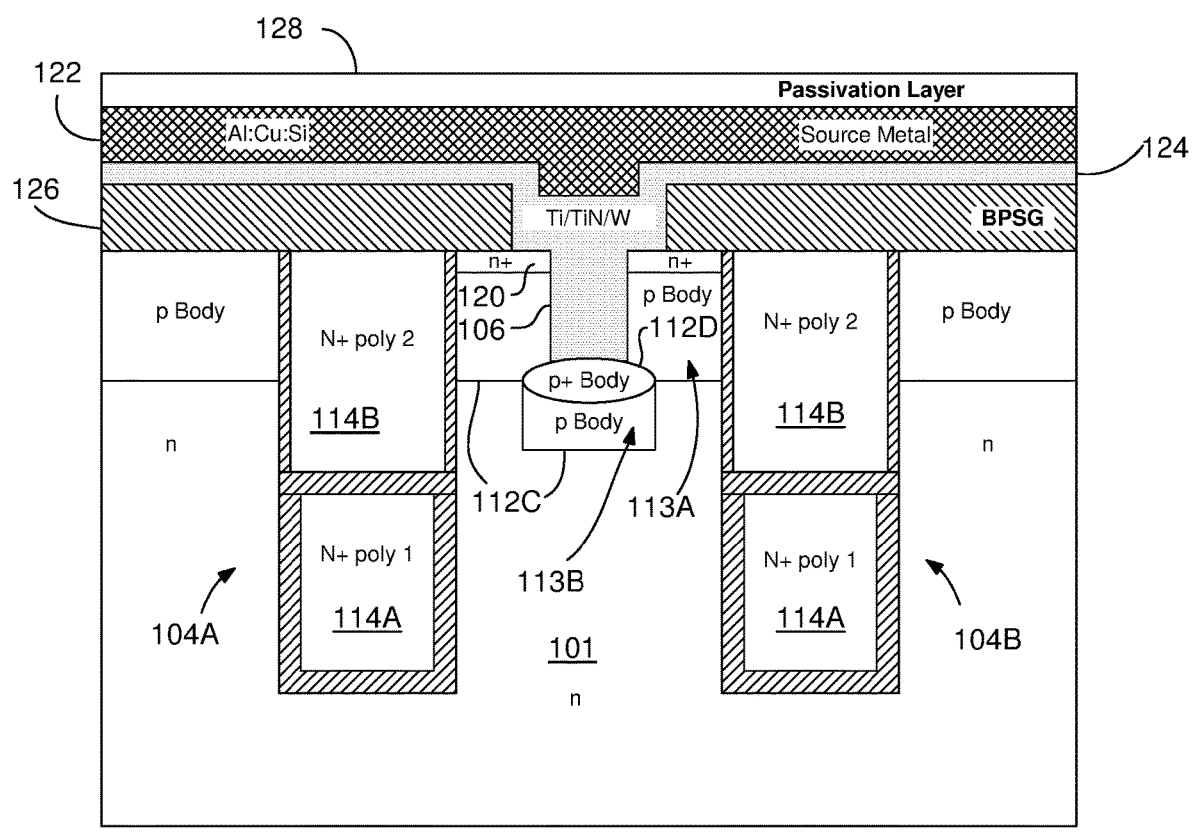
FIG. 1H illustrates a double poly with p shield trench MOSFET structure with T-shape p body.
Figure 2A:
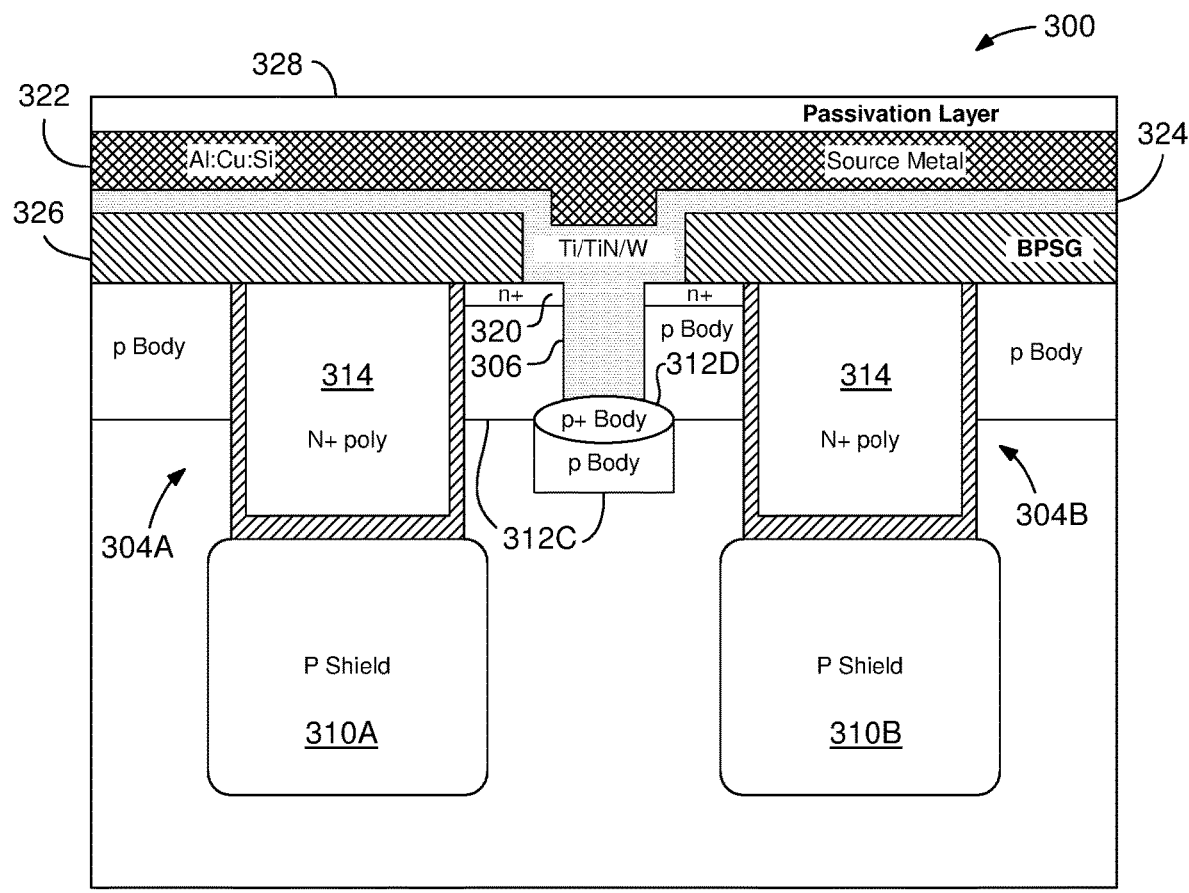
FIG. 2A illustrates a p shield single poly trench MOSFET structure with active cell with T-shaped p body.
Figure 2B:
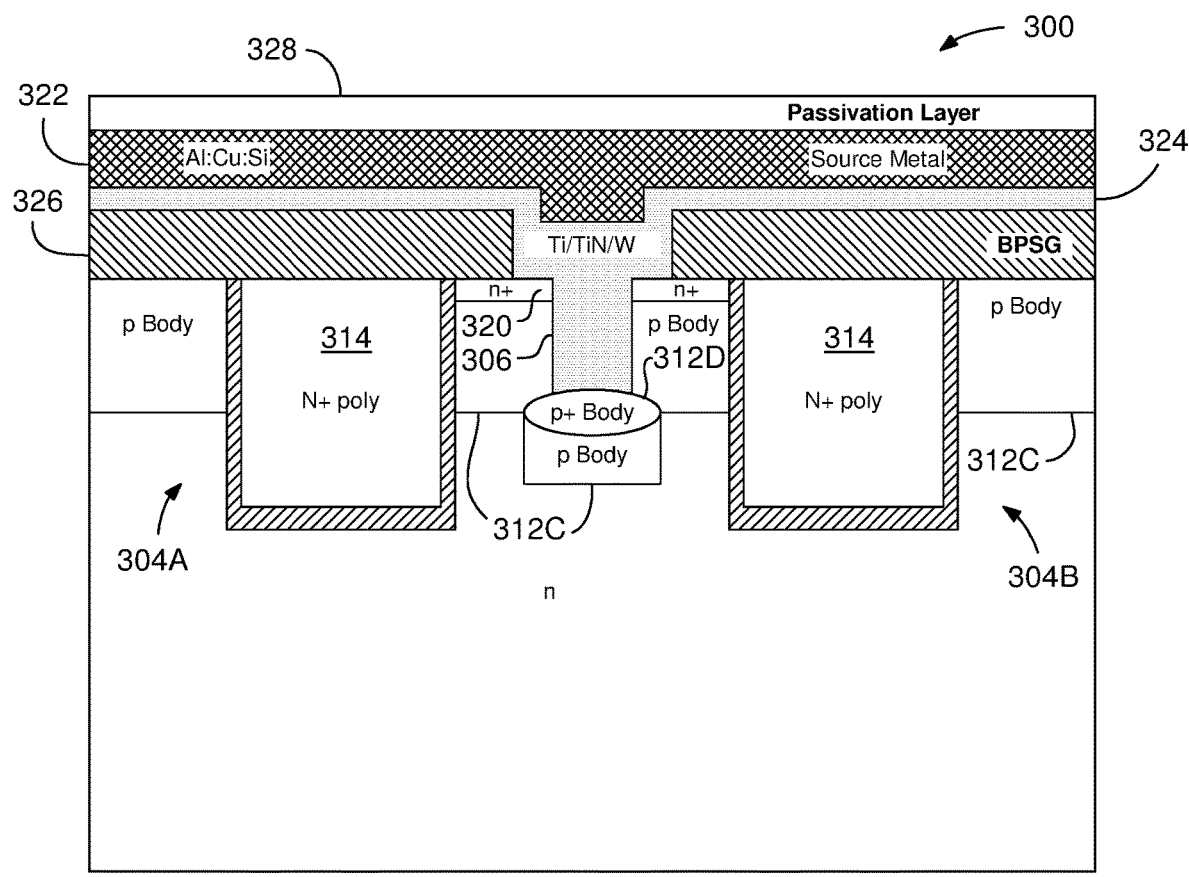
FIG. 2B illustrates a single poly trench MOSFET structure with active cell region.

Various embodiments of the present invention for various trench MOSFET device structures with self-aligned p+ body regions are shown in FIGS. 1A through 1H and in FIGS. 2A and 2B. Process flows for manufacturing various trench MOSFET device structures with self-aligned p+ body regions are shown in FIGS. 3B-3N, FIGS. 4B-4J and FIG. 5.

Figure 3A:
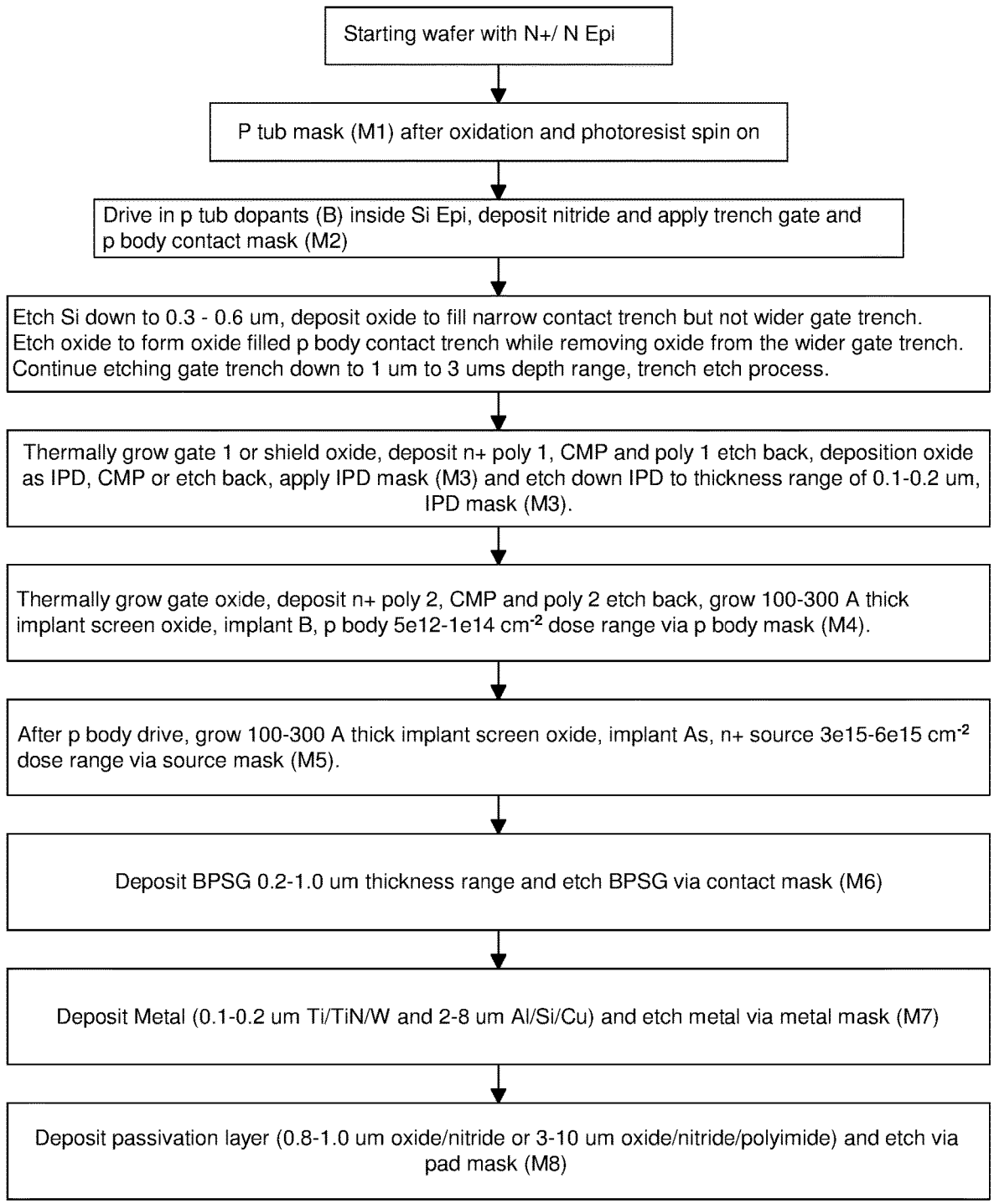
FIG. 3A is a flow chart showing a process embodiment for the structure FIGS. 1A-1F.
Figure 3B:
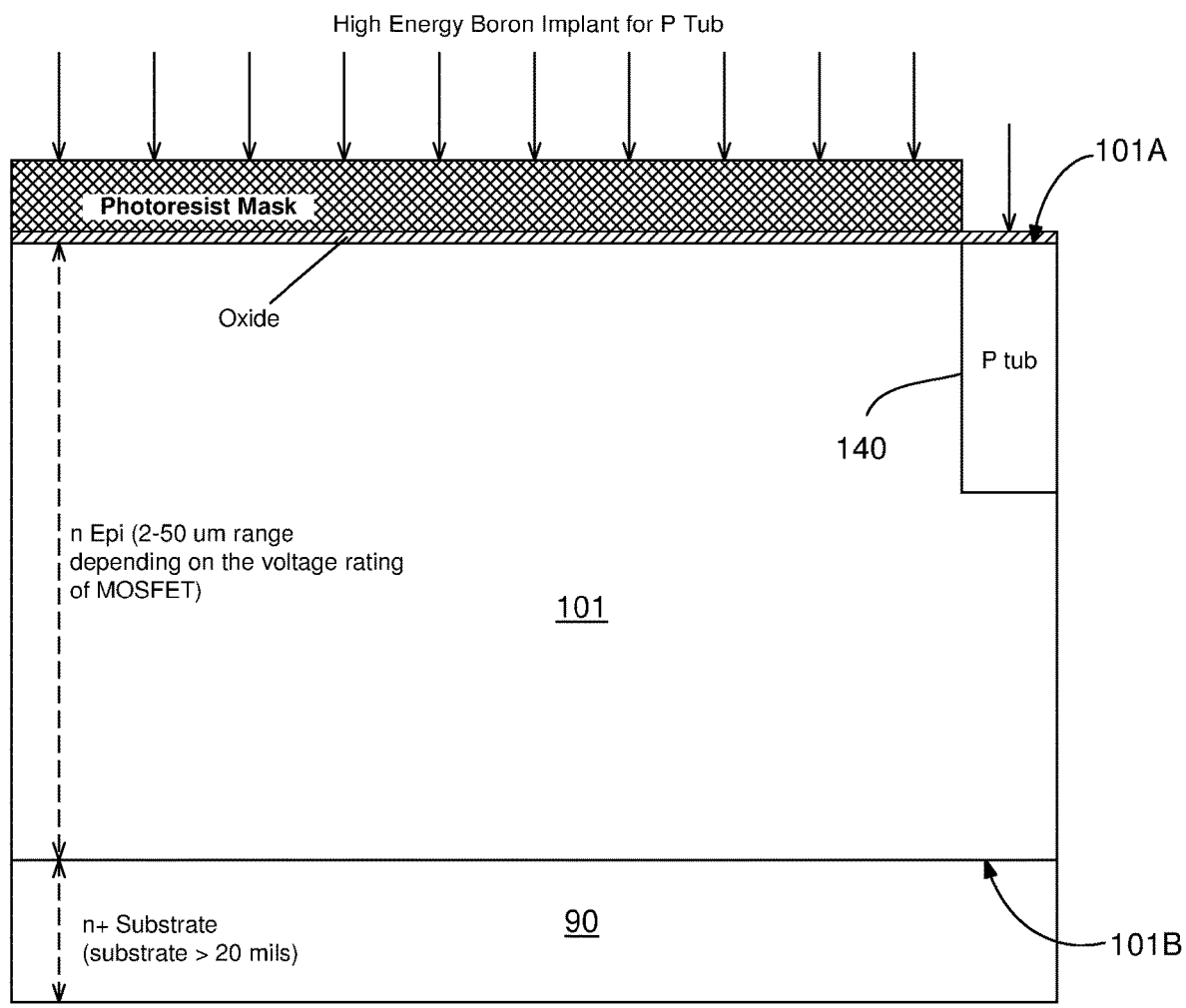
FIG. 3B illustrates a starting wafer including n+ substrate having n epitaxial layer deposited thereon.

FIG. 1A illustrates, in schematic cross-sectional view, an embodiment of an active cell structure in a trench MOSFET device 100 including a semiconductor layer 101 having a front surface 101A or a top surface 101A and a back surface 101B which may overlie a semiconductor substrate 90 (FIG. 3B). The semiconductor layer 101 and the semiconductor substrate 90 shown in FIG. 1A is just a small exemplary portion of a larger die (not shown) or wafer that may include the exemplary active cell structure shown in FIG. 1A. As will be shown below many semiconductor structures and active cell regions described in this disclosure may be form on the same die using various processes using the same or different masking stages.

In one embodiment, the semiconductor layer 101 may be an epitaxial (epi) single crystal silicon layer grown over the semiconductor substrate 90 which may be a silicon substrate or wafer. The semiconductor layer may have n type of conductivity, or first type of conductivity, i.e., doped with n type of dopants, such as arsenic (As) or phosphor (P). The semiconductor substrate 90 may also have n type of conductivity; however, it is doped with an n type of dopant concentration higher than the n dopant concentration of the semiconductor layer 101, which is denoted with n+.

The semiconductor layer 101 may include an array of a plurality of MOS gate trenches 104 and p body contact trenches 106 formed in an alternating fashion in an active area 108 of the MOSFET device 100, and extending orthogonally toward the back surface 101B from the front surface 101A. For clarity figures in this disclosure generally show only two gate trenches 104, first gate trench 104A and a second gate trench 104B, located at both sides of the p body contact trench 106. In the following disclosure MOS gate trenches will be referred to as gate trenches 104 and the p body contact trenches will be referred to as contact trenches 106.

However, a MOSFET device may include a plurality of gate trenches and contact trenches disposed in an alternating fashion, i.e, an order of "gate trench/contact trench/gate trench/contact trench/ . . . ", in an active area of the device.

Referring to FIG. 1A, the gate trenches 104 and the contact trench are rectangular in cross-section formed in the semiconductor layer 101 by patterning and etching the front surface 101A, and they extend parallel to one another along the front surface 101A of the semiconductor layer 101. During the process of forming them, the gate trenches 104 and the contact trenches 106 may be self-aligned in the semiconductor layer 101, i.e., the measured distance separating each gate and contact trench in the array is always the same.

The gate trenches 104 are defined by side walls 105A and a bottom wall 105B, and the contact trenches 106 are defined by side walls 107A and a bottom wall 107B. The contact trench 106 is symmetrically positioned between the gate trenches 104. The gate trenches 104 have a first depth denoted with D1 and a first width denoted with W1. Contact trenches 106 have a second depth denoted with D2 and a second width denoted with W2. In one embodiment, D1 may be greater than D2 and W1 may be greater than W2. In another embodiment, D1/2 may be greater than D2 and W1/2 may be greater than W2. The first depth D1 may be in the range of about 1-6 microns and the second depth D2 may be in the range of about 0.3-1 micron. The first width W1 may be in the range of about 0.4-2 microns and the second width W2 may be in the range of about 0.1-0.3 microns.

Each gate trench 104 may include a shield region 110 such as a first shield region 110A under the first gate trench 104A and a second shield region 110B under the second gate trench 104B. The shield regions 110 may have an elliptically curved border uniformly extending from the bottom wall 105B of each gate trench toward the back surface 101B. The shield regions 110 may be formed by implanting dopants with p type conductivity, such as boron (B), or a second type of conductivity, to the semiconductor layer 101 through the bottom wall 105B of the gate trench 104. The p type shield regions 110 under the gate trenches 104 help reduce the electric field at the bottom of the gate trenches 104.

A first contact region 112A or, a first p body region (p body), having a second type conductivity, may be formed by implanting p type dopants to the semiconductor layer 101 through the front surface 101A. The first contact region 112A has a rectangular cross section and formed in a portion of the semiconductor layer 101 between the gate trenches 104. The first contact region 112A has a depth D3 measured from the front surface 101A. The depth D3 of the first contact region 112A is less than the first depth D1 of the gate trench 104 and greater than the second depth D2 of the contact trench 106. An exemplary depth D3 for the first contact region may be in the range of about 0.3-1.0 micron.

The gate trenches 104 may be filled with a conductive structure 114 or layer. A first insulation layer 116A formed by the oxidation of the side walls 105A and the bottom wall 105B electrically insulate the conductive structure 114 filling the gate trenches 104. In this embodiment the conductive structure 114 may have a first conductive structure 114A filling a bottom half of the gate trench 104 and a second conductive structure 114B filling the upper half of the gate trench 104. In one embodiment, the first conductive structure 114A and the second conductive structure 114B include n+ poly silicon material (n+ poly). The first conductive structure 114A may be electrically insulated from the second conductive structure 114B by a second insulation layer 116B. The second insulation layer 116B may be an interpoly dielectric (IPD) material, for example $SiO_2$ (silicon oxide). This arrangement of poly silicon structures in the insulated gate trenches may be called double poly or shielded gate trench (SGT) structure including n+ poly 1 (first n+ poly silicon layer) and n+ poly 2 (second n+ poly silicon layer). Shielded gate trench structure yields low drain to gate capacitance for faster switching of the MOSFET device. A second contact region 112B, or the second p body region (p+ body), may be formed under the contact trench by implanting dopants of the second type of conductivity through the bottom wall 107B of the contact trench 106. The second contact region 112B may be doped with a p type dopant concentration higher than the p dopant concentration of the first contact region 112A, which is denoted with p+. The second contact region 112B may be in contact with a contact conductor 118 filling the contact trench 106 and includes an elliptic curved border expanding from the bottom wall 107B and extending symmetrically in the direction of the gate trenches and the back surface 101B from the bottom wall. The second contact region 112B may be disposed about a symmetry center between two neighboring gate trenches 104A, 104B. The distance '$d_1$' between the left edge of the second contact region 112B and the side wall 105A of the gate trench 104A on the left may be equal to a distance '$d_2$' between the right edge of the second contact region 112B and the side wall 105A of the gate trench 104B on the right are the same.

Referring to FIG. 1A, n+ source contact regions adjacent the front surface 101A may extend between the contact conductor 118 and the gate trenches 104 at both sides of the contact trench 106. The contact conductors 118 are part of a buffer layer 124 or buffer metal 124. A source electrode 122, or source metal 122, may be in contact with the n+ source contact regions 120, the first contact region 112A and the second contact region 112B by the buffer layer 124 extending through a dielectric layer 126 and into the contact trenches 106. The dielectric layer may be a borophosphosilicate (BPSG) layer. A passivation layer 128 may coat the source electrode 122. The buffer layer 124 may be a layer of Ti/TiN/W which prevents aluminum spike into silicon and damaging shallow p body to drain junction. The source 122 electrode may be one of a layer of Al:Cu:Si, a layer of Al:Si or a layer of Al:Cu.

FIG. 1B shows the cross sectional view an exemplary gate contact region of the trench MOSFET device 100 with the gate trenches 104 including double layers including n+ poly Si and having p shield regions extending from them. In this embodiment, a gate electrode 132 may be connected to the second conductive structure 114B, (n+ poly Si), of the gate trench 104A via a gate buffer layer 134 extending through the dielectric layer 126. Gate contact 136 contacting the second conductive structure 114B may be planar type, not trench type, because the gate contact forming step may only include the etching of the BPSG dielectric layer 126. In the gate contact region, a region of second type of conductivity 140, or a p tub region 140, formed around the second gate trench 104B and the second shield region 110B may connect (short) the second shield region 110B to the source electrode by connecting the shield region 110B to the first contact region 112A (p body). The gate contact region shown in FIG. 1B and the active cell region shown in FIG. 1A, are integral part of the power MOSFET device.

FIG. 1C shows in side view a structure in the trench MOSFET device 100 including an exemplary contact to the first conductive structure (n+ poly 1) and p shield shorting to source via the p tub. In this embodiment, the source electrode 122 may be connected to the first conductive structure 114A, (n+ poly Si), of the gate trench 104A via the buffer layer 124 extending through both the dielectric layer 126 and an insulation structure 142A, such as BPSG or $SiO_2$, formed on the first conductive structure 114A. The p tub region 140, formed around the second gate trench 104B and the second shield region 110B may connect (short) the second shield region 110B to the source electrode 122 by connecting the shield region 110B to the first contact region 112A (p body) for robust power MOSFET device construction. The gate contact region shown in FIG. 1C and the active cell region shown in FIG. 1A are on the same power MOSFET device or die.

FIG. 1D shows an alternative structure in a trench MOSFET device 200 with an integrated Schottky diode region. A source electrode 222 may be connected to an n− region 245 via a buffer layer 224 extending through a dielectric layer 226 and thereby forming a Schottky contact 246. The n− region may be formed in a gap 247 between p body regions 212A in the semiconductor layer 201. The p tub regions 240, formed around the gate trenches 204A, 204B and their shield regions may connect (short) the shield region 210A, 210B to the source electrode 222 by connecting the shield region 210B to the p body 212A to prevent floating of the shield regions. Floating shield regions may slow down the switching speed of the power MOSFET therefore shorting of the floating regions to source is critical for fast switching power MOSFET.

FIG. 1E double poly with p shield trench MOSFET structure with edge termination with p tub and BPSG filled trench region. FIG. 1E shows, in s cross sectional view, an exemplary edge termination region structure in the trench MOSFET device 100 including a contact to the first conductive structure (n+ poly 1) and p shield shorting to source via the p tub. In this embodiment, the contact trenches 104A and 104B in an edge termination region 150A (die edge) may only include the first conductive structures 114A (first n+ poly silicon layer) and the rest of the trenches are filled with insulation structures 142A, 142B, including BPSG or $SiO_2$.

The source electrode 122 may be connected to the first conductive structure 114A, (first n+ poly Si layer), in the gate trench 104A via the buffer layer 124 extending through both the dielectric layer 126 and the insulation structure 142A located on the first conductive structure 114A. The p tub region 140, formed around both gate trenches 104A, 104B and the shield regions 110A, 110B may connect (short) the shield regions to the source electrode 122 by connecting the shield regions to the first contact region 112A (p body) to achieve high breakdown in the termination region. The edge termination region 150B may also include a n+ channel stop 152. The edge termination region shown in FIG. 1E and the active cell region shown in FIG. 1A may be on the same die.

FIG. 1F shows, cross sectional view, an alternative edge termination region structure in the trench MOSFET device 100 including a contact to the first conductive structure (n+ poly 1) and no shorting to the source electrode via the p tub. In this embodiment, for example, the contact trench 104A in an edge termination region 150B (die edge) may only include the first conductive structures 114A (first n+ poly silicon layer) and the rest of the trench is filled with the insulation structures 142A, including BPSG or $SiO_2$.

The source electrode 122 may be connected to the first conductive structure 114A, (n+ poly Si) the buffer layer 124 extending through both the dielectric layer 126 and the insulation structure 142A located on the first conductive structure 114A. The p tub region 140, may not connect (short) the shield region to the source electrode 122. The edge termination region may also include an n+ channel stop 152. As an alternative structure, the termination region structure shown in FIG. 1F may replace the termination region structure shown in FIG. 1E on the die.

FIG. 1G illustrates, in schematic cross sectional view, another embodiment for an active cell structure in the trench MOSFET device 100. Differing from the active cell structure embodiment shown in FIG. 1A, in this embodiment a first contact region 112C or p body region between the gate trenches 104 may have a T shape p body extending between the gate trenches 104. Furthermore, the active cell structure shown in FIG. 1G may or may not include a p tub 140 depending on the location of the active cells on the die. For example if the active cell structure is located at an edge location of the array including a plurality gate trenches and the contact trenches, the active cell structure may have a p tub shorted to the first contact region 112C. Rest of the structure components are described in the description of the FIG. 1A and will not be repeated for FIG. 1G for clarity purposes. In this embodiment, width and depth related dimensions of the gate and contact trenches are the same as the dimensions used in the description of FIG. 1A. The first contact region 112C may be formed by implanting dopants with the second type of conductivity to the semiconductor body extending between the gate trenches of the array. Each contact trench 106 is disposed within the first contact region 112C. The first contact region 112C has a horizontal body section 113A extending parallel to the front surface 101A and a vertical body section 113B extending orthogonally from a central part of the horizontal body section 113A. The first and the second sections of the first contact region 112C have also rectangular cross-sections. The first contact region 112C has a depth D3 measured orthogonally from the front surface 101A to the bottom border of the vertical section 113B. The depth D3 of the first contact region 112C may be less than the first depth D1 of the gate trenches 104 and greater than the second depth D2 of the contact trench 106. An exemplary depth D3 for the first contact region 112C may be in the range of about 0.3-1 micron.

In this embodiment a second contact region 112D, or the second p body region (p+ body), may be also formed under the contact trench 106 by implanting dopants of the second type of conductivity through the bottom wall 107B of the contact trench 106. The second contact region 112D may be doped with a p type dopant concentration higher than the p dopant concentration of the first contact region 112C, which is denoted with p+. The second contact region 112D may be in contact with a contact conductor 118 filling the contact trench 106 and includes an elliptic curved border expanding from the bottom wall 107B and extending symmetrically in the direction of the gate trenches and the back surface 101B from the bottom wall. As the second contact region 112B in FIG. 1A, the second contact region 112D is disposed about a symmetry center between two neighboring gate trenches. The second contact region 112D may be formed partially in the horizontal section 113A and the vertical section 113B of the first contact region 112C, i.e. extends from the first section 113A to the second section 113B, as shown in FIG. 1G.

FIG. 1H illustrates, in schematic cross sectional view, another embodiment for an active cell structure in the trench MOSFET device 100 shown in FIG. 1G. Differing from the active cell structure embodiment shown in FIG. 1G, in this embodiment, the gate trenches 104A and 104B may not include shield regions 110A and 110B shown in FIG. 1G. Furthermore, the active cell structure shown in FIG. 1H may not include p tub.

FIGS. 2A and 2B illustrates, in schematic side views, embodiments for active cell structures in the trench MOSFET device 300 having single poly silicon (single poly) including gate trenches with or without shield regions and T shape p body region. The rest of the active cell structures are similar to the active cell structures in described in connection with FIG. 1G and FIG. 1H. FIGS. 2A and 2B show an embodiment of an active cell structure of a trench MOSFET device 300 including gate trenches 304A and 304B and the contact trench 306 in the semiconductor layer 301. The contact trench 306 is in the first contact region 312C (p body region), which is T shaped, and in contact with the second contact region 312D (p+ body). Each contact trench 304 may include conductive structure 314 which is n+ poly silicon. Side walls and the bottom wall of the contact trenches include an insulation layer, such as $SiO_2$ insulating the n+ poly silicon. In the embodiments shown in FIGS. 2A-2B, the depth D1 of gate trenches 304 may be equal to or less than half of the gate trench depth given in the double poly embodiments shown above. Accordingly, in this embodiment the first contact region depth D3 is less than the depth D1 of the gate trenches and greater than the depth D2 of the contact trenches. In this embodiment, widths of the gate and contact trenches 304, 306 are the same as the widths given in the above embodiments. Differing from the embodiment in FIG. 2B, in FIG. 2A embodiment, the gate trenches 304 may include p shield regions 310. In comparison to the p shield regions shown in FIGS. 1A-1H, p shield regions 310 are larger and deeper regions. In one example, total depth of both the gate trench 304 and the p shield region may be twice the depth D1 of gate trench 304.

Process steps of forming the various trench MOSFET structures including gate trenches with double poly silicon layers and p shield regions, and other features, described through FIGS. 1A to FIG. 1F are generally described below with FIGS. 3A-3W.

FIG. 3A is a process flow chart showing the major process flow steps in relation to the masking steps described in FIG. 3B. For example: Mask-1 (M1) for forming p tub, Mask-2 (M2) for forming gate and contact trenches, Mask-3 (M3) for forming IPD (inter poly dielectric) layer, Mask-4 (M4) for forming p body regions, Mask-5 (M5) for forming n+ source region, Mask-6 (M6) for forming contacts, Mask-7 (M7) for forming metal layer (source electrode), and Mask-8 (M8) for forming passivation layer (optional for 30V and below MOSFETs).

FIG. 3B shows processing with M1 mask for forming the p tub 140. Here, starting wafer or die is the n epitaxial layer (epitaxial silicon layer) 101 over the n+ substrate 90. The thickness of the n+ substrate 90 may be greater than 500 µm. The thickness of the n epitaxial layer 101, for 20-400V MOSFETs, may be in the range of 2 to 40 µm.

Figure 3C:
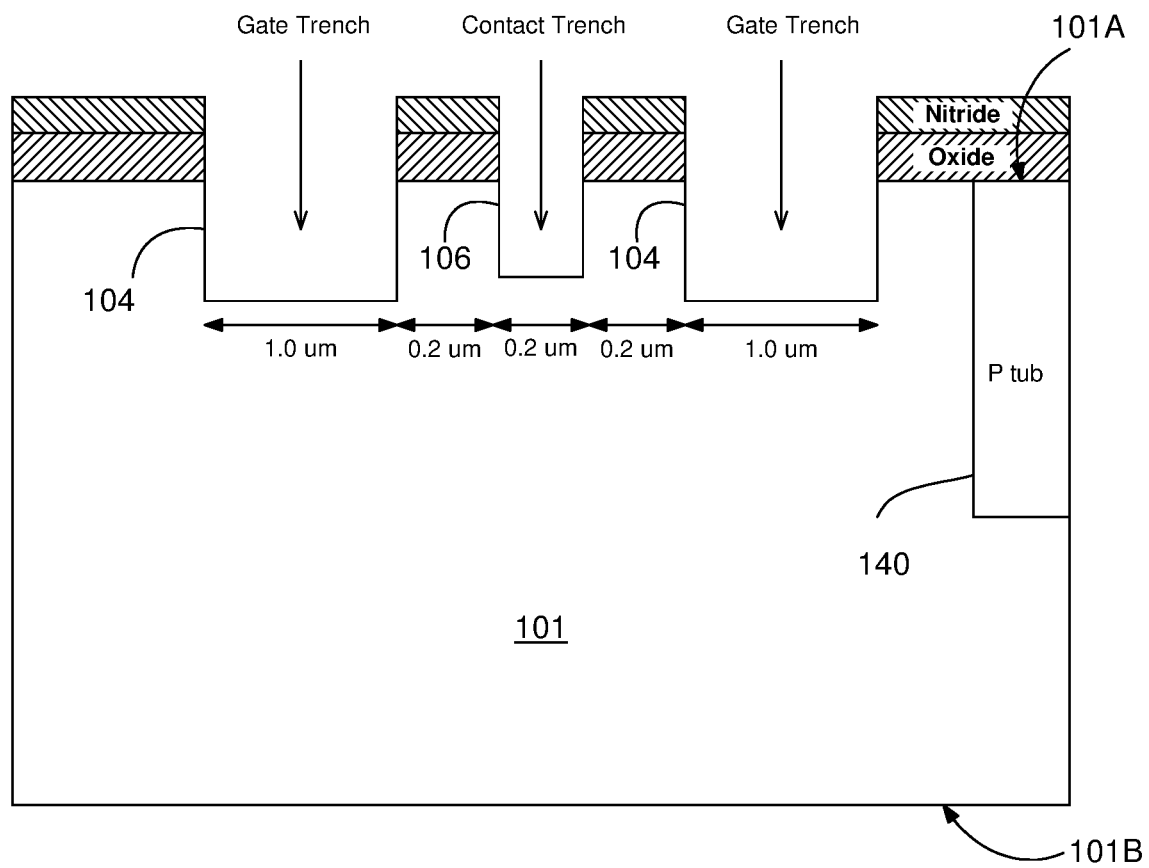
FIGS. 3C-3E illustrate use of Mask 2 which is gate trench and contact trench mask.

FIG. 3C shows processing with M2 mask for forming the gate trenches 104 and the contact trench 106. Figures in this application are not to scale and may only show the n epitaxial layer portion of the wafer for the simplicity purposes. In step 1, of the process with M2 mask, boron (B) may be driven into silicon epi to form deep enough p tub regions, after implanting p dopants for forming p tub 140. In step 2, an oxide layer having 0.3-1 µm thickness and a nitride layer having 0.05-0.1 µm thickness may be deposited over the n epitaxial layer 101. In step 3, M2 mask may be used to define gate and contact trench regions. In step 4, n epitaxial layer 101 may be etched down in the range of 0.3-1 µm.

Figure 3D:
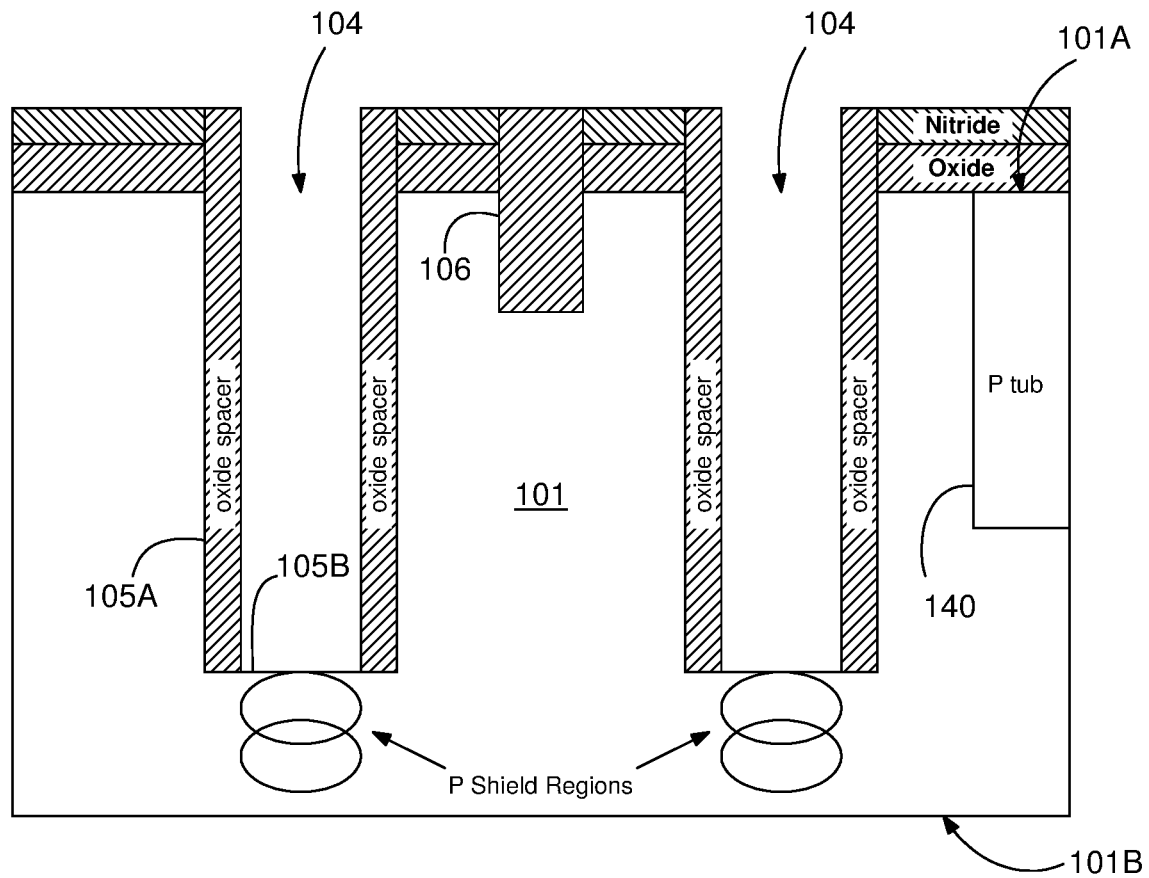

FIG. 3D shows further processing with M2 mask to form the gate trenches 104 and the contact trench 106. In step 5, the etching of n epitaxial layer 101 (Si layer) may be stopped and an oxide layer ($SiO_2$) with a thickness range of 0.1-0.2 µm may be deposited over the top surface of the n epitaxial layer 101 to fill narrow contact trenches while not filling the wider gate trenches. In step 6, the oxide layer may be etched using for example RIE (reactive ion etch) process while using nitride as etch-stopper. The etching process may form oxide spacers inside the wider gate trenches while keeping narrow contact trenches fully filled with oxide as shown in FIG. 3D.

Figure 3E:
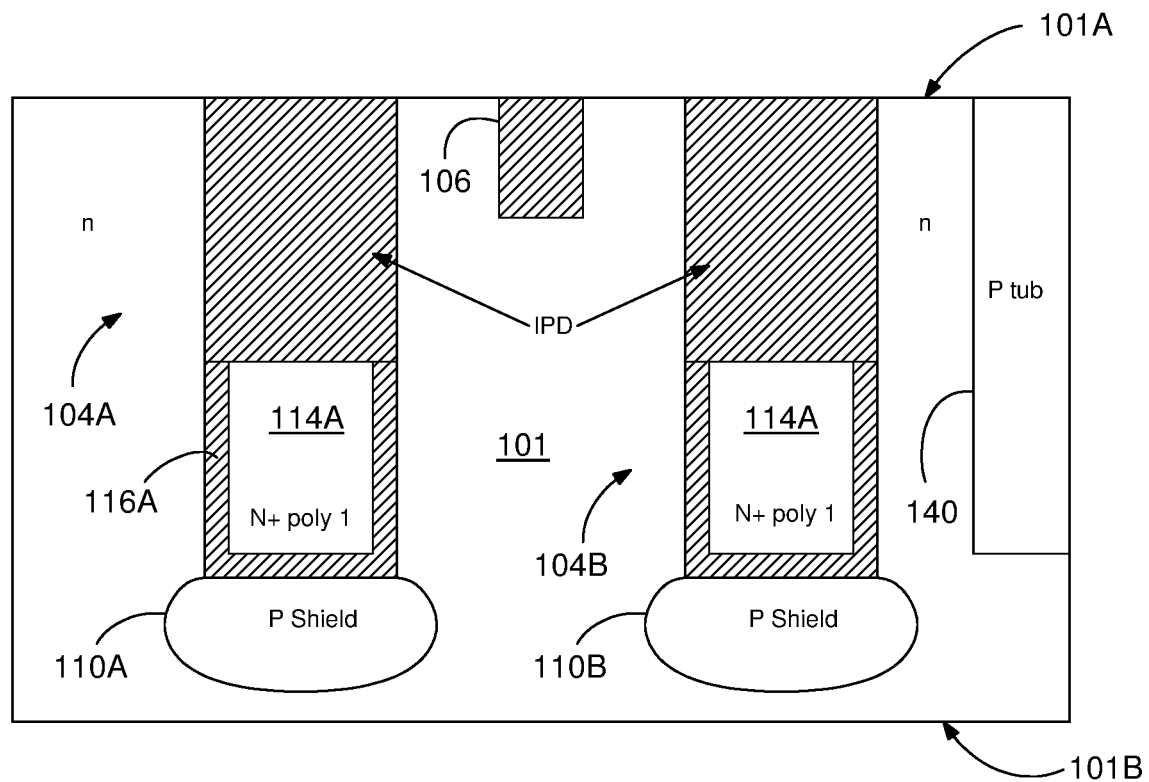

In step 7, a high energy, such as 60 KeV-2 MeV, boron implant (p type conductivity), for example in the range of 1E12-5E12 $cm^{-2}$, may be implanted through bottom walls 105B of the gate trenches 104 to form p shield regions 110 beneath the gate trenches 104. In step 8, p shield implant may be driven into the n epitaxial layer 101, $Si_3N_4$ and the $SiO_2$ layers may be removed and a shield gate oxide 116A (insulation layer), for example in a thickness range of 500-5000 Angstrom (Å), may be thermally grown or portion thermally grown and depositing oxide layer inside the trench walls 105A. In step 9, n+ doped poly silicon (first poly or poly 1) layer 114A (the first conductive structure), having a thickness in the range of 0.3-1 µm, may be deposited over the front surface 101A of the n epitaxial layer to fill the gate trenches 104, and next the deposited n+ poly silicon layer may be planarized using CMP (chemical mechanical polishing) or etch back planarization processes. In step 10, the deposited poly silicon layer may be etched down to a targeted depth within the bottom half of the trenches to form the first poly layer 114A. In step 11, IPD, an oxide layer having a thickness in the range of 0.3-0.7 µm, may be deposited to fill all the trenches, and next this oxide layer may be planarized using CMP or etch back processes. Etched down IPD in a best controlled fashion to minimize IPD thickness variation, this is usually done by buffered HF, the final structure is shown in FIG. 3E.

Figure 3F:
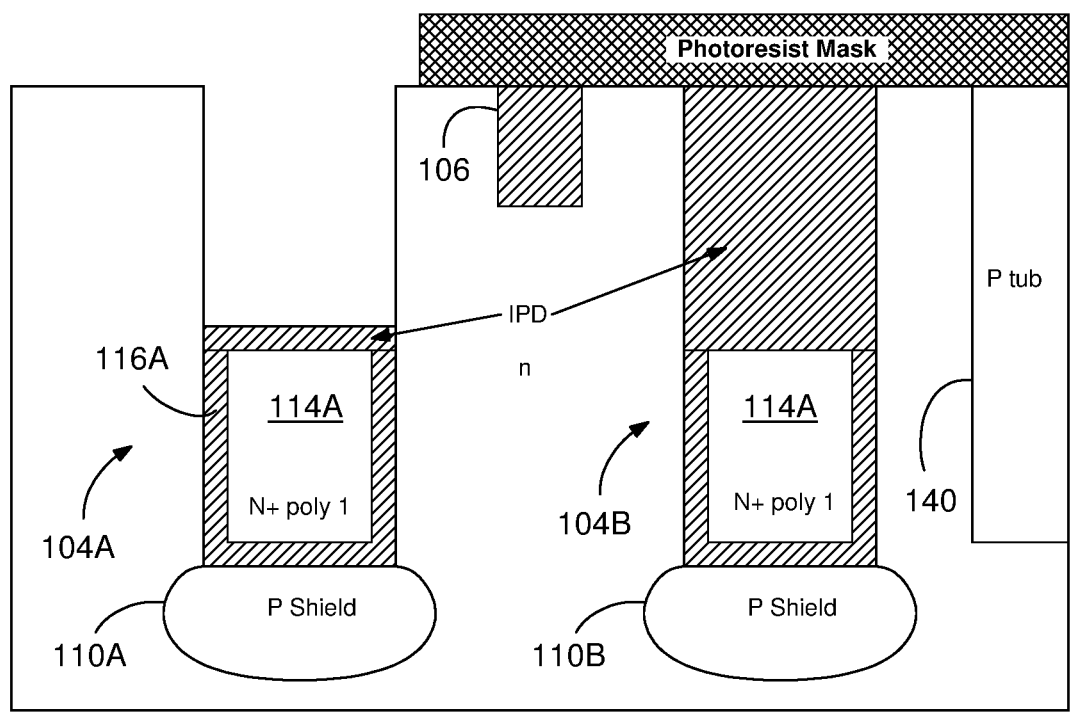
FIG. 3F illustrates use of Mask 3 which is inter poly dielectric (IPD) mask.
Figure 3G:
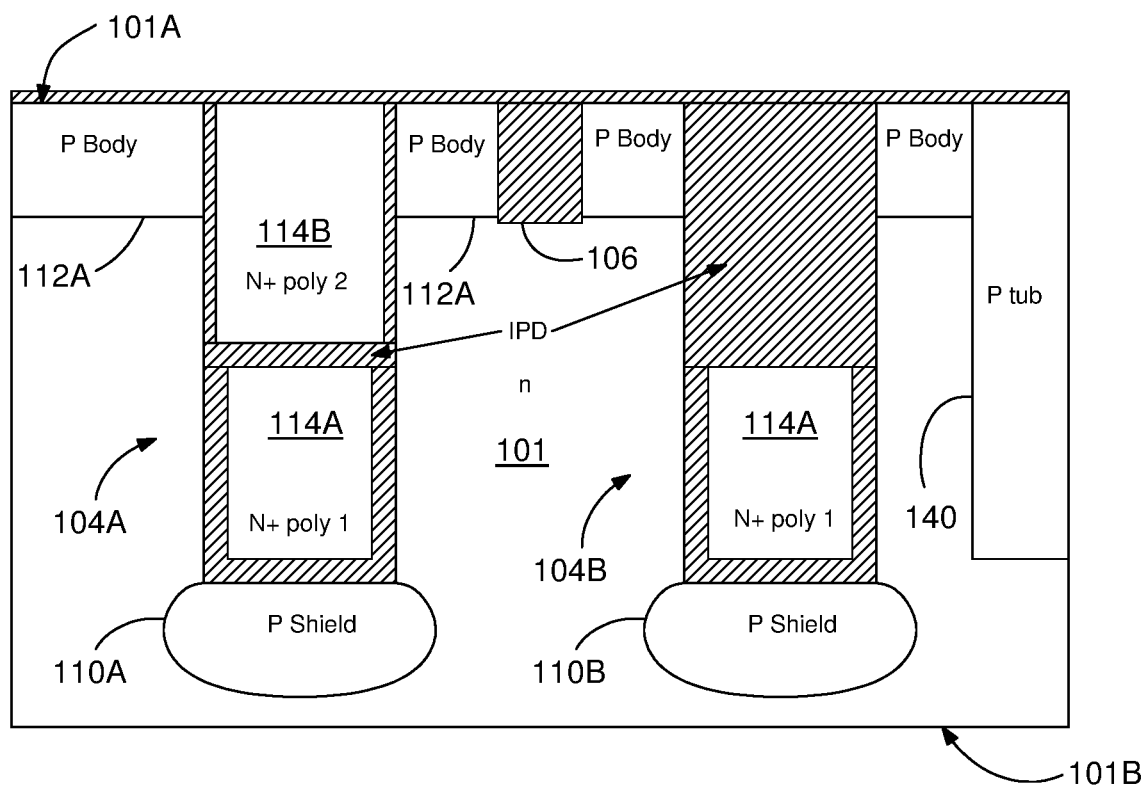
FIGS. 3G-3H illustrate use of Mask 4 which is p body mask.
Figure 3H:
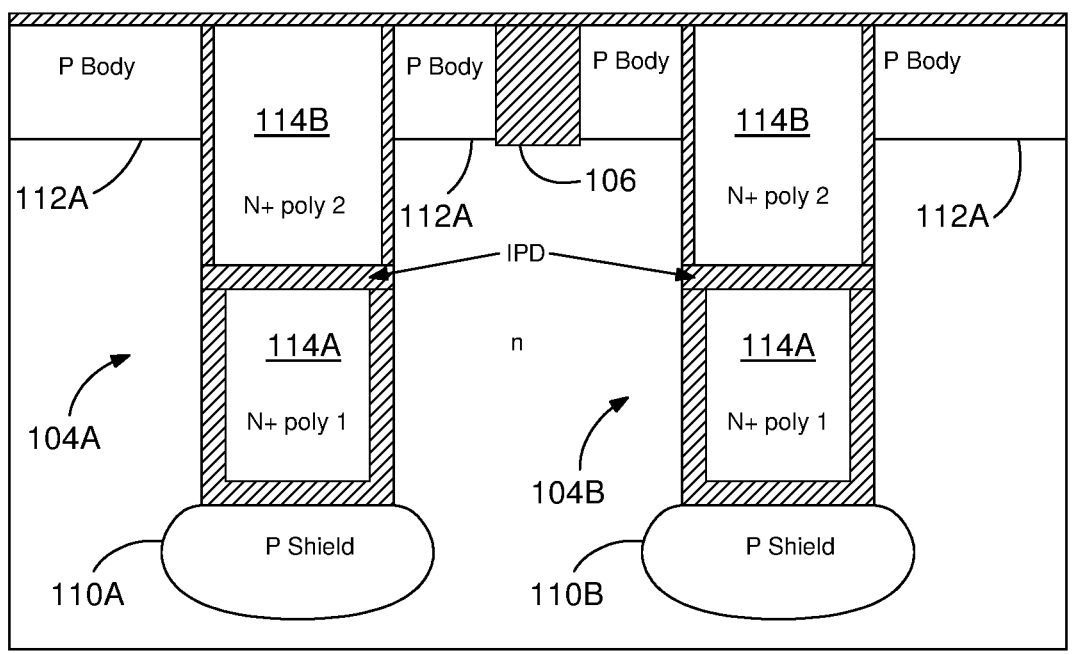

FIG. 3F shows final structure after IPD etched down using M3 mask and controlled oxide etching. After etching the IPD down to desired thickness, a gate oxide layer is grown thermally including a few percent Chlorine to prevent drifting of the threshold voltage of the Power MOSFET's. The second n+ poly (poly 2 or second poly) layer may be deposited on the gate oxide to fill the gate trench 104 and covering the whole silicon surface, which the second n+ poly layer may be either etched down or planarized using the CMP process to form the second n+ poly layer 114B in the gate trench 104. Next, M4 mask may be used to implant p body of the trench MOSFETs. FIG. 3G and FIG. 3H show the special and active cell structures respectively after the P body ion implantation.

Figure 3I:
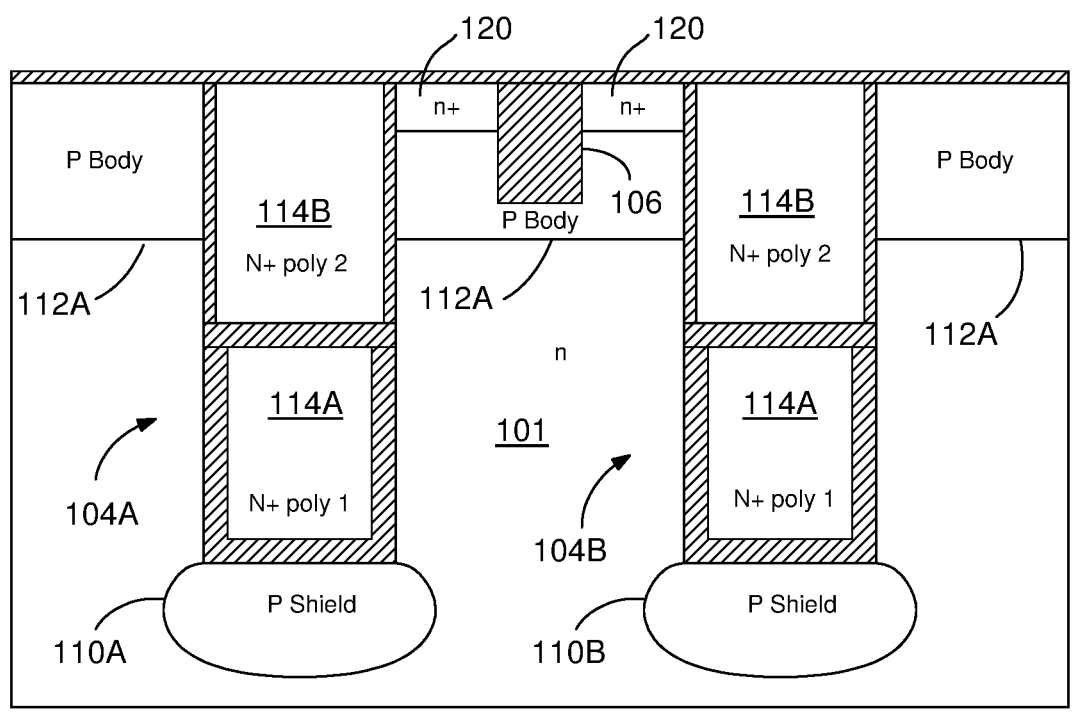
FIGS. 3I-3J illustrate use of Mask 5 which is an n+ source mask.
Figure 3J:
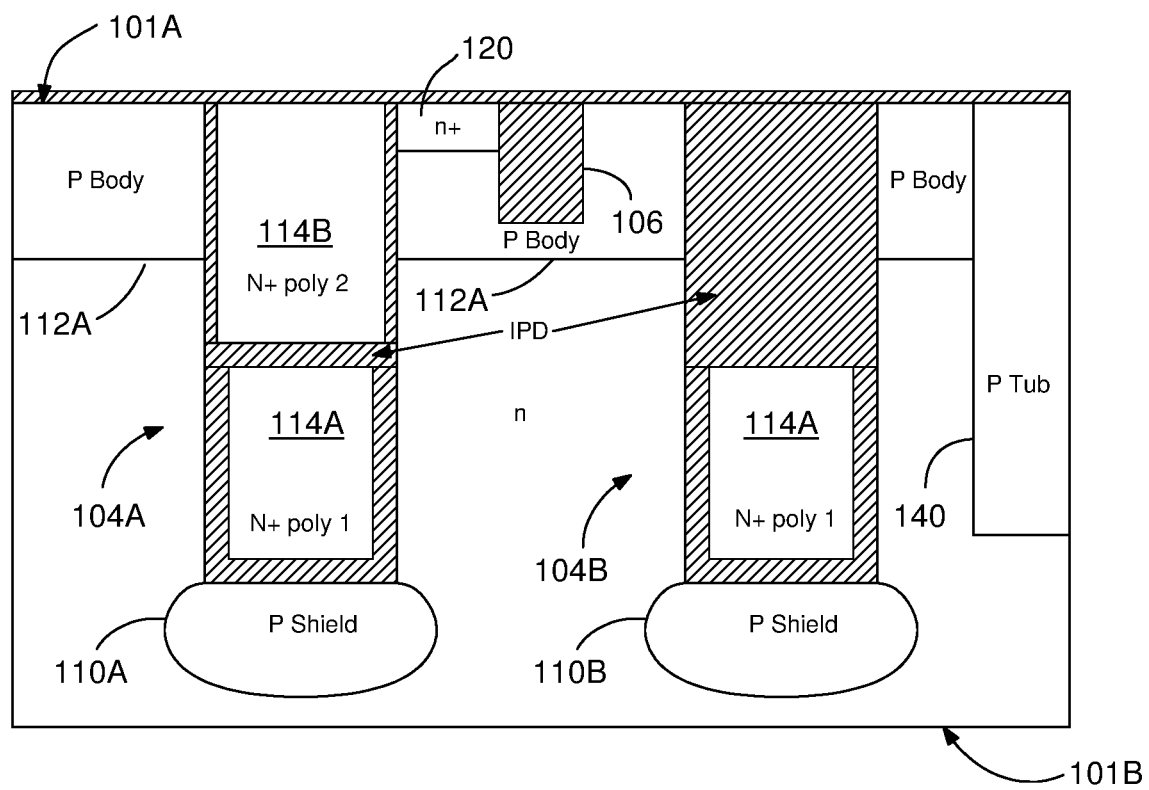

FIG. 3I and FIG. 3J show processing with M5 mask for forming n+ source region by Arsenic ion implanting. FIG. 3I shows the active trench MOSFET region. FIG. 3J shows half active cell with the first gate trench 104A having the first and second n+ poly layers 114A and 114B, and the second trench 104B having only the first n+ poly layer 114A under IPD filled trench upper part.

Figure 3K:
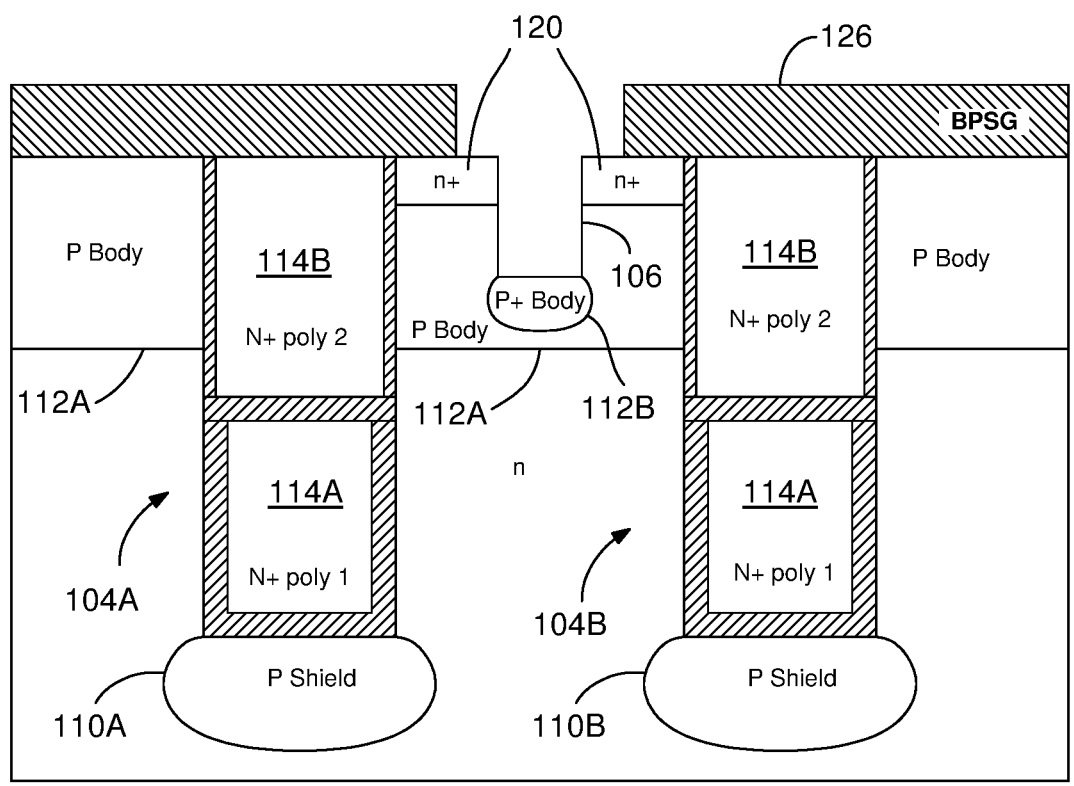
FIGS. 3K-3M illustrate use of Mask 6 which is a contact mask.

FIG. 3K shows process step with M6 mask or contact mask for forming contacts in the active cell region. Prior to applying the M6 mask to open contacts, BPSG layer 126 may be deposited and the M6 mask is applied to etch the BPSG and oxide layer filling the contact trenches 106 and implant B ions or $BF_2$ to form p+ body contact region 112B under the contact trench 106. Next BPSG layer 126 may be reflowed.

Figure 3L:
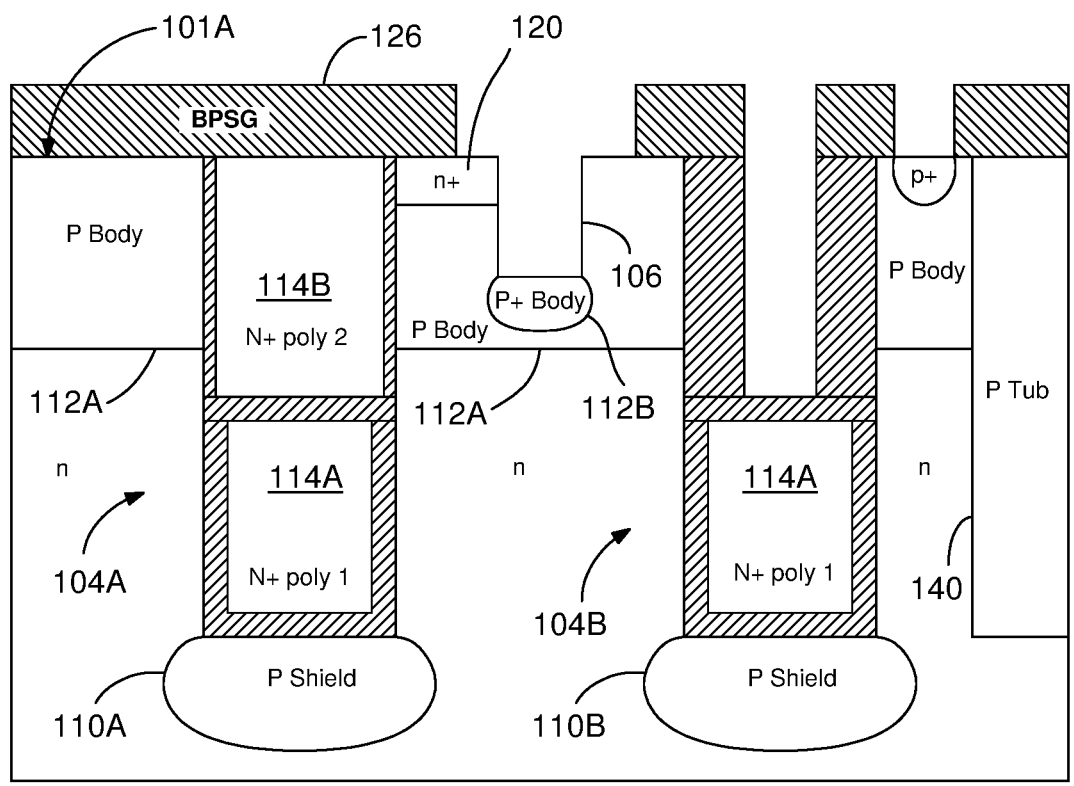

FIG. 3L also shows processing with M6 mask or contact mask for forming contacts to first n+ poly layer 114A and active half cell region in active MOSFET, the first n+ poly layer 114A and the p+ body contact regions 112B.

Figure 3M:
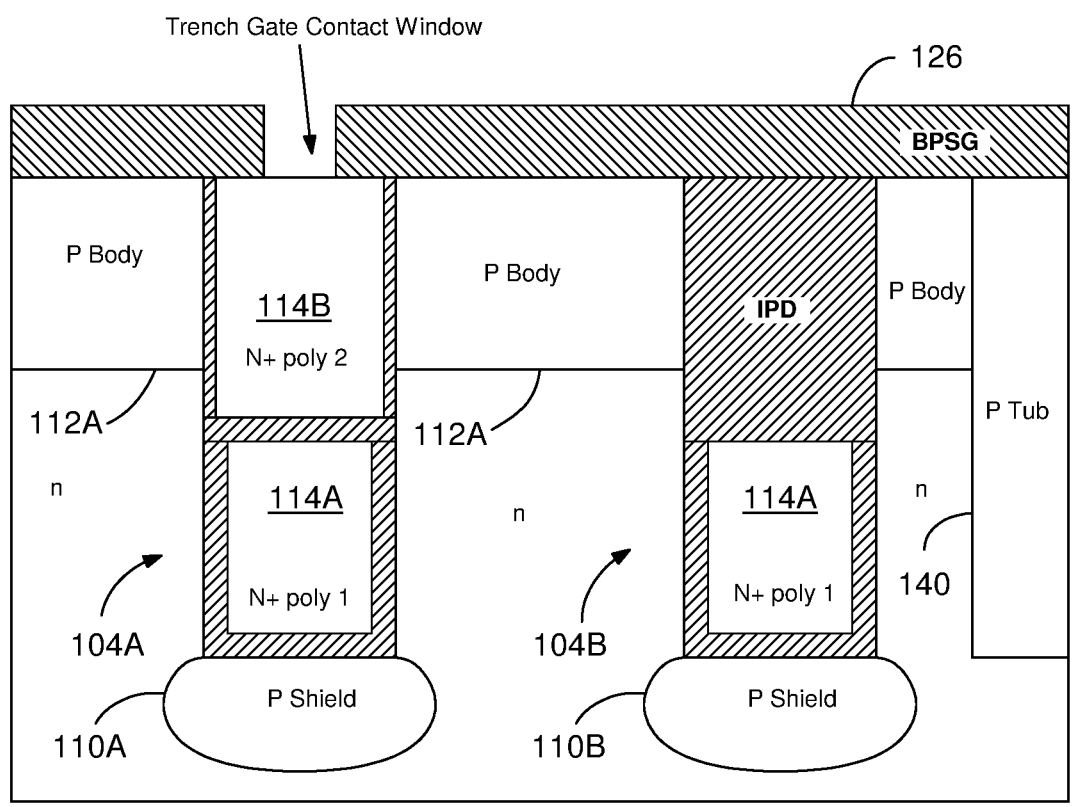

FIG. 3M also shows processing with M6 mask for forming contacts in the gate trench 104 to the second n+ poly layer 114B.

Figure 3N:
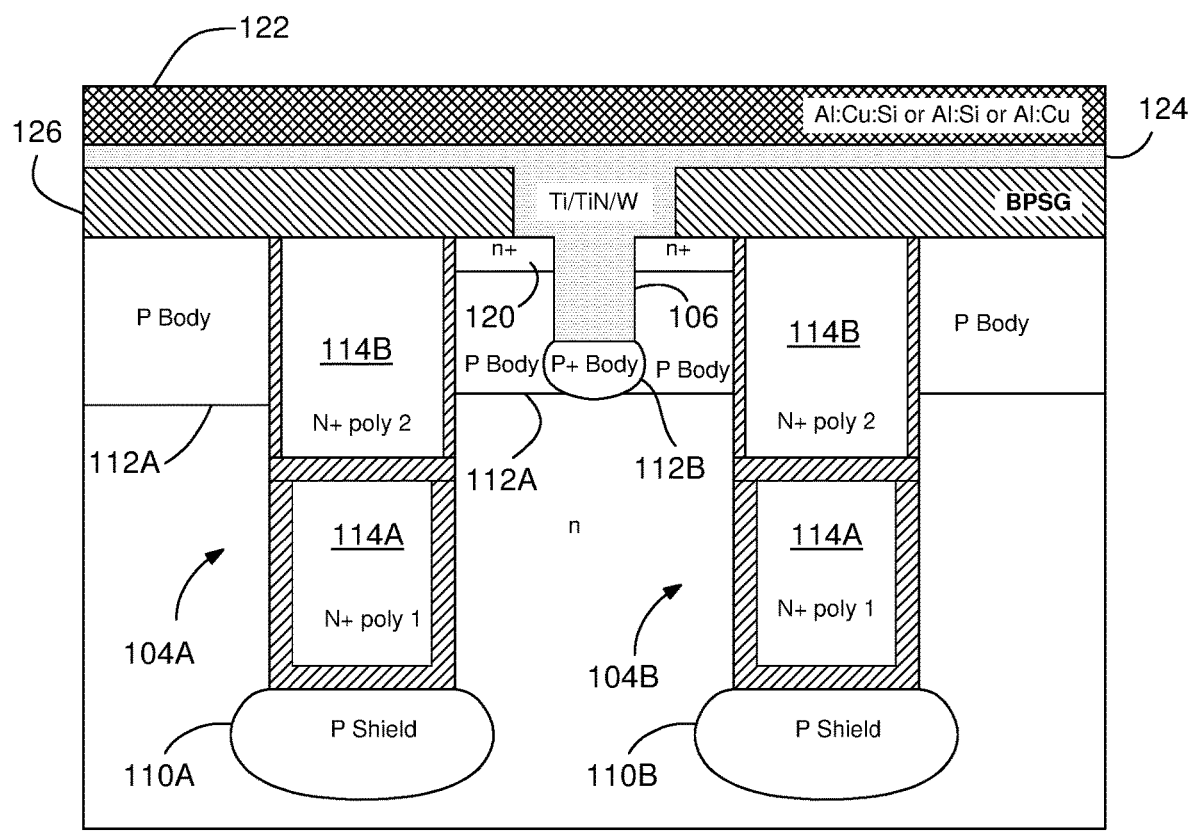
FIG. 3N-3P illustrate use of Mask 7 which is metal mask.
Figure 3O:
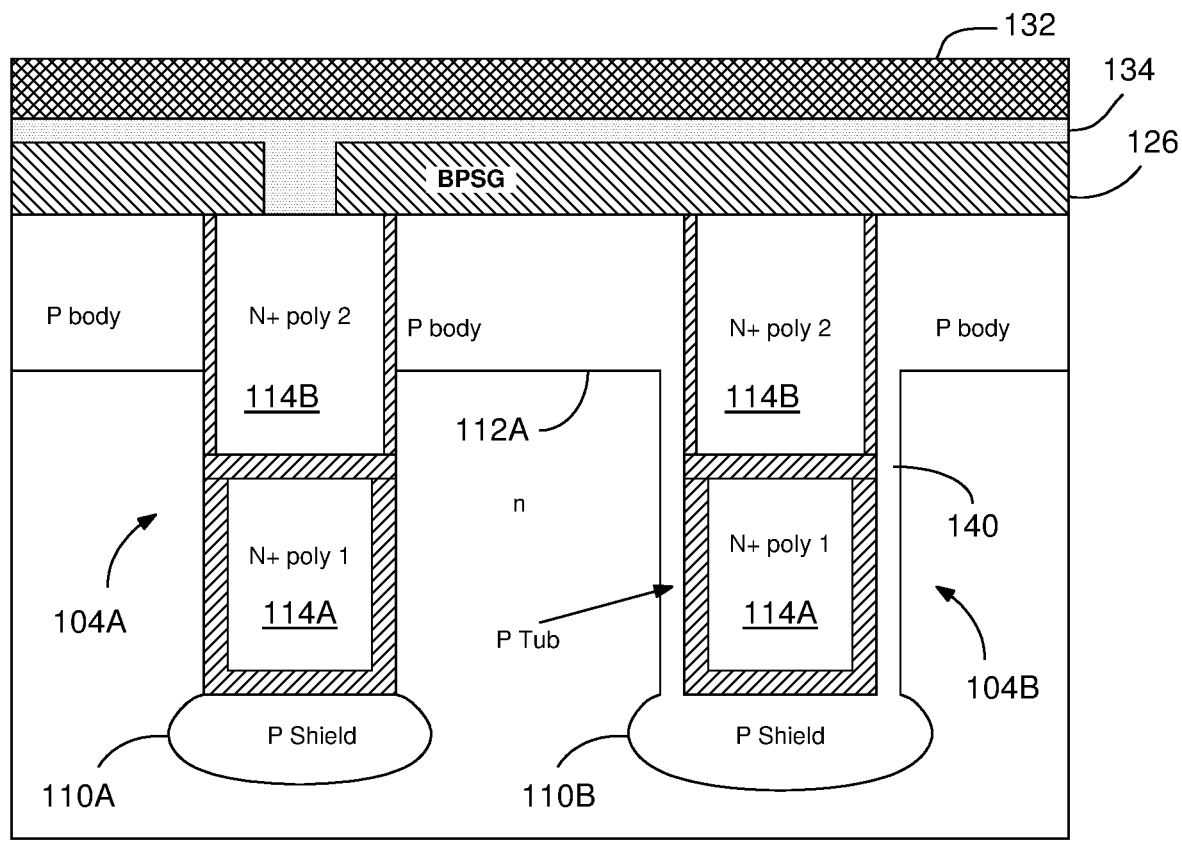
Figure 3P:
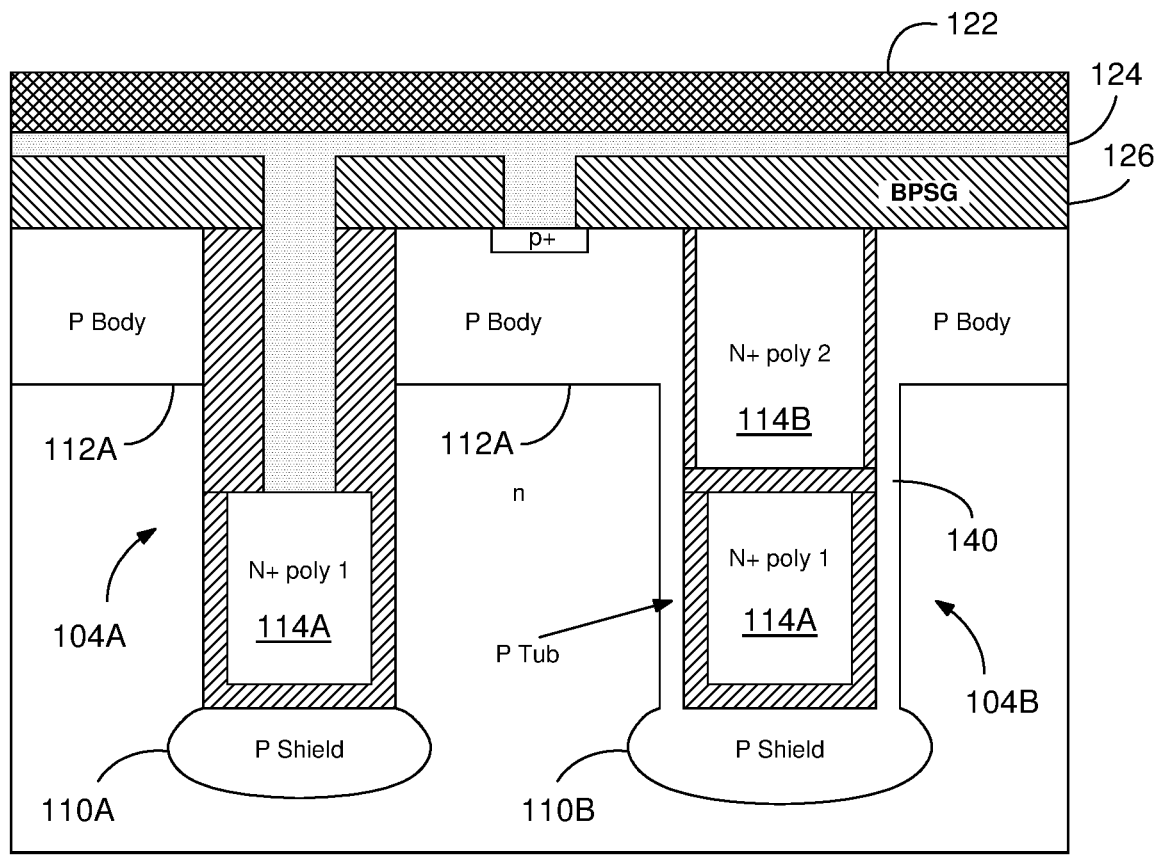
Figure 3R:
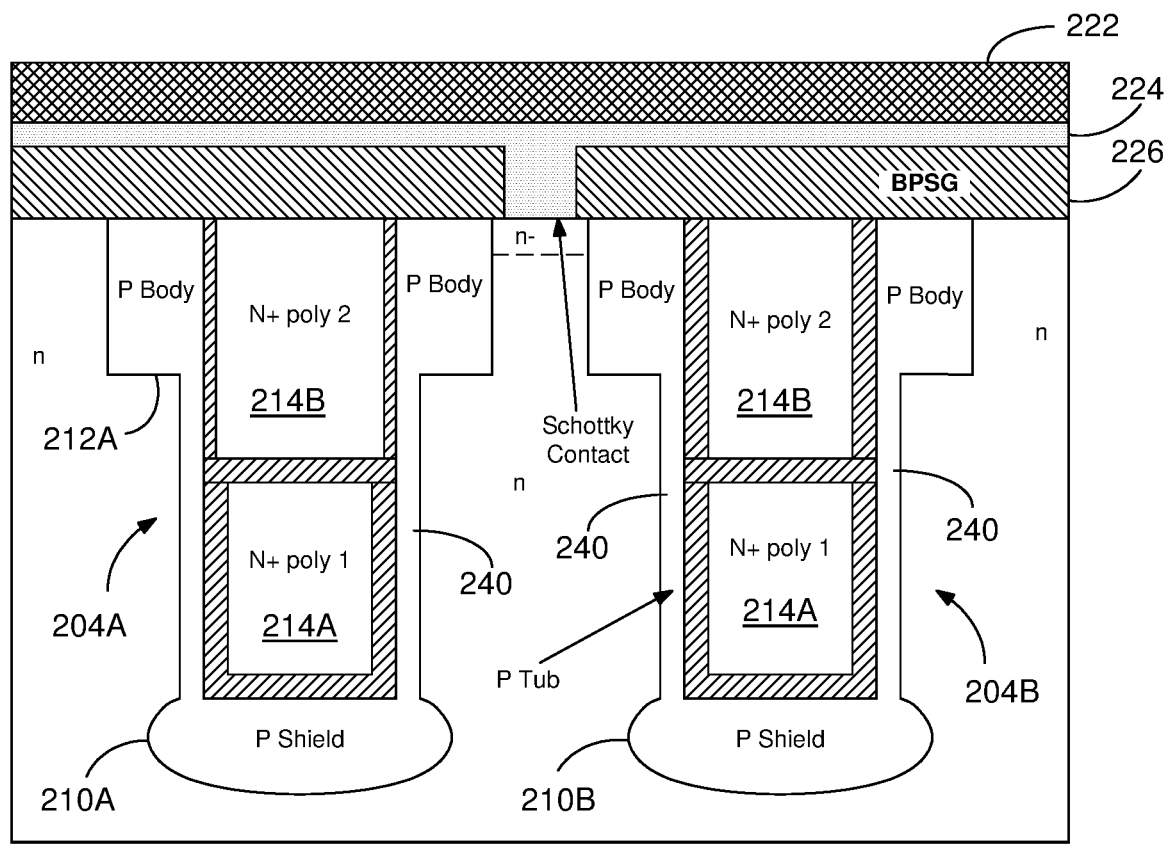
FIG. 3R illustrates Schottky diode option with p+ block mask.
Figure 3S:
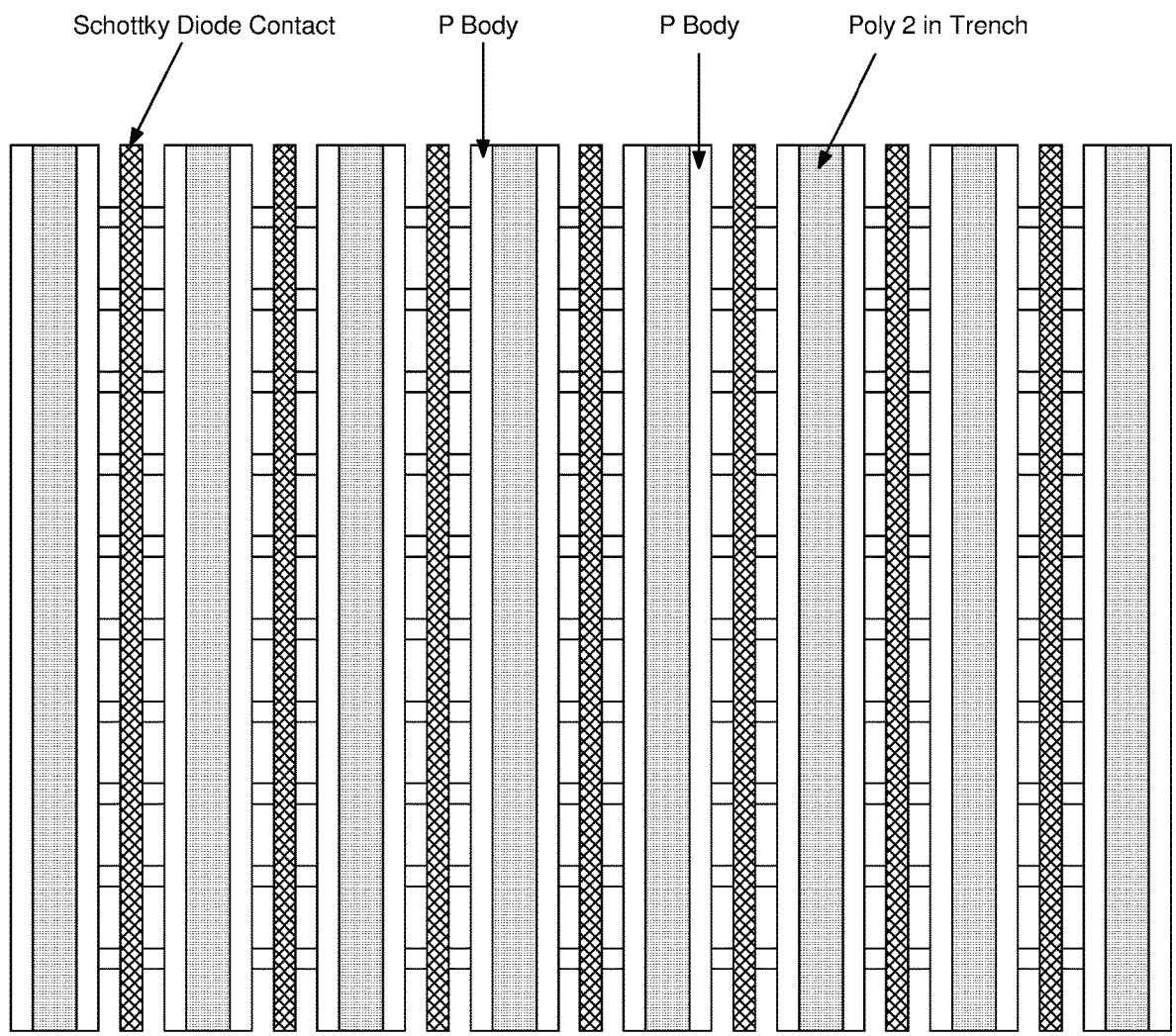
FIG. 3S illustrates a view of an integrated Schottky diode.
Figure 3T:
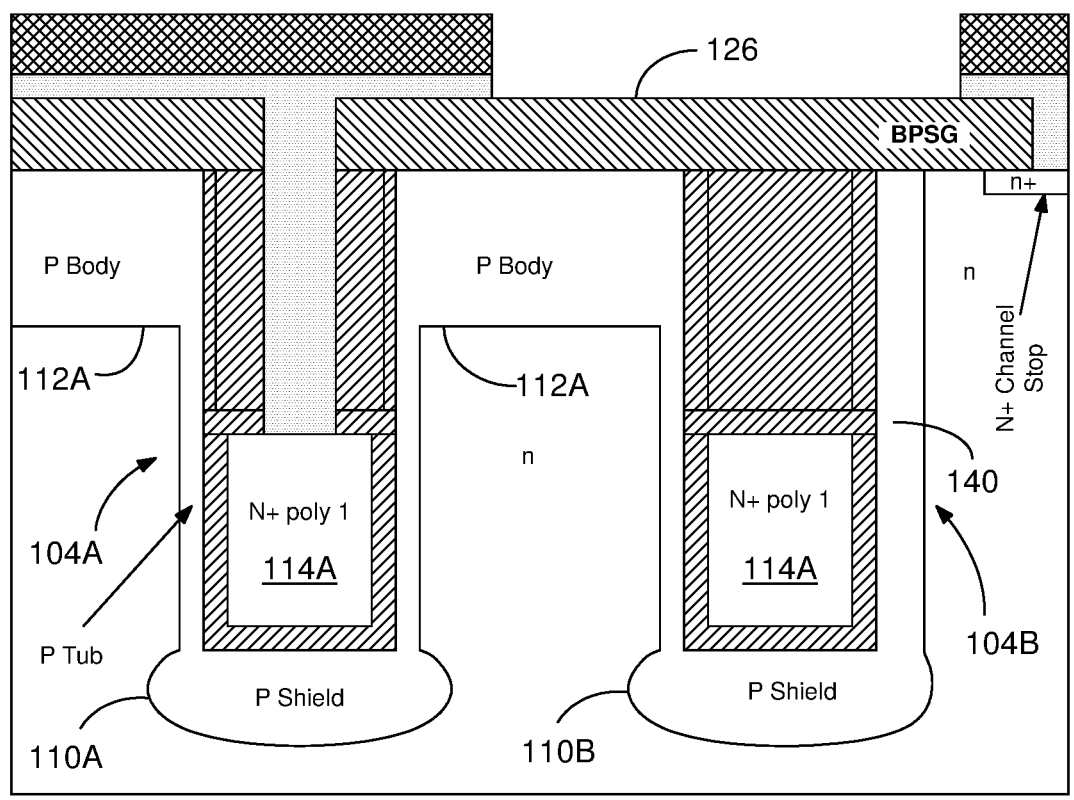
FIG. 3T illustrates edge termination with p tub and BPSG filled trench after metal mask.
Figure 3U:
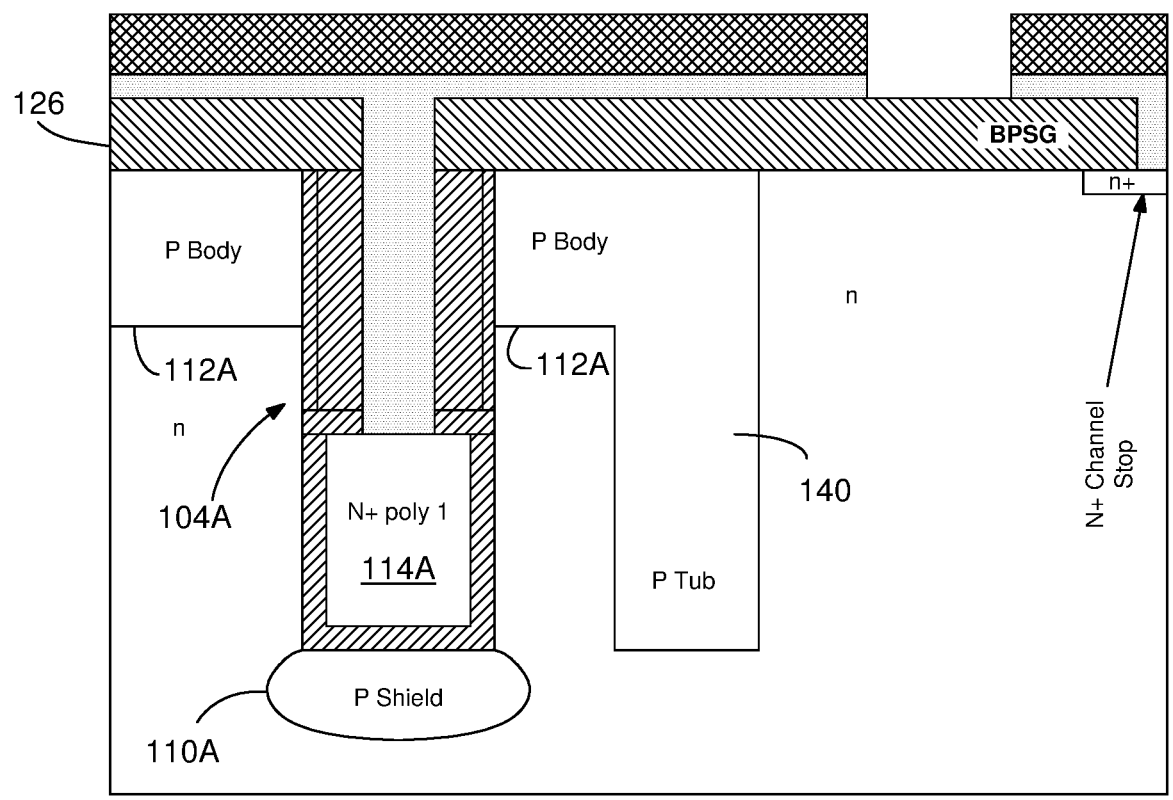
FIG. 3U illustrate another embodiment of edge termination with p tub after metal mask.

FIG. 3N, FIG. 3O, Figure T and FIG. 3U show the structures or cross sections from the different device areas after the processing with metal mask, M7 mask. First buffer metal layer including Ti/TiN/W may be deposited on top of BPSG layer and all contact windows and a layer of Al:Cu:Si may be then deposited on top of the Ti/TiN/W buffer layer.

FIG. 3N shows p+ body contact trench filled by metal layer in active trench MOSFET region, which is also shown in FIG. 1A. The process forms a trench MOSFET device comprising a plurality of trenches including the gate trenches 104 having a first depth ranging from 0.8 to 3 µm and a first width ranging from 0.3 to 2. µm and the contact trenches 106 having a second depth ranging from 0.3 to 0.6 µm and a second width ranging from 0.1 to 0.7 µm which are smaller than the first depth and the first width. The gate trench 104 is a MOS gate trench having an oxide layer as gate insulator and n+ poly silicon forming the MOSFET gate region. The contact trench 106 which is a p body contact trench may be located inside a p body region 112A adjacent to the contact trench 106, wherein a heavily doped p+ body region 112B located at the bottom of the contact trench 106 is in electrical contact with a source electrode 122 via a contact filling of the contact trench 104. In this MOSFET structure as shown in FIG. 3N, the p+ body region 112B is located equal distance from the MOS gate trench.

FIG. 3O shows a contact between the gate metal 132 and the second n+ poly layer 114B in the gate trench 104 via the buffer layer 124 in active trench MOSFET region, which is also shown in FIG. 1B.

FIG. 3P also shows processing with M7 mask or metal mask for forming a first n+ poly layer contact region. Here, both the first n+ poly layer contact region and a p+ body contact region connected to p shield region 110 B, thereby shorting to source electrode 122 via the p tub. This is also shown in FIG. 1C.

FIG. 3R shows an embodiment for forming a Schottky diode by processing with p+ implant block mask. The Schottky diode may be formed between the p tubs 240 and p body regions 212A, which may require an additional p+ implant block mask after the contact openings. This is also shown in FIG. 1C.

FIG. 3S shows a schematic top view of an embodiment of an integrated Schottky diode.

FIG. 3T shows a structure, after the metal mask processing, including edge termination with p tub and IPD filled trench. This is also shown in FIG. 1E.

FIG. 3U shows a structure, after the metal mask processing, including another embodiment of edge termination with p tub. This is also shown in FIG. 1F.

Figure 3V:
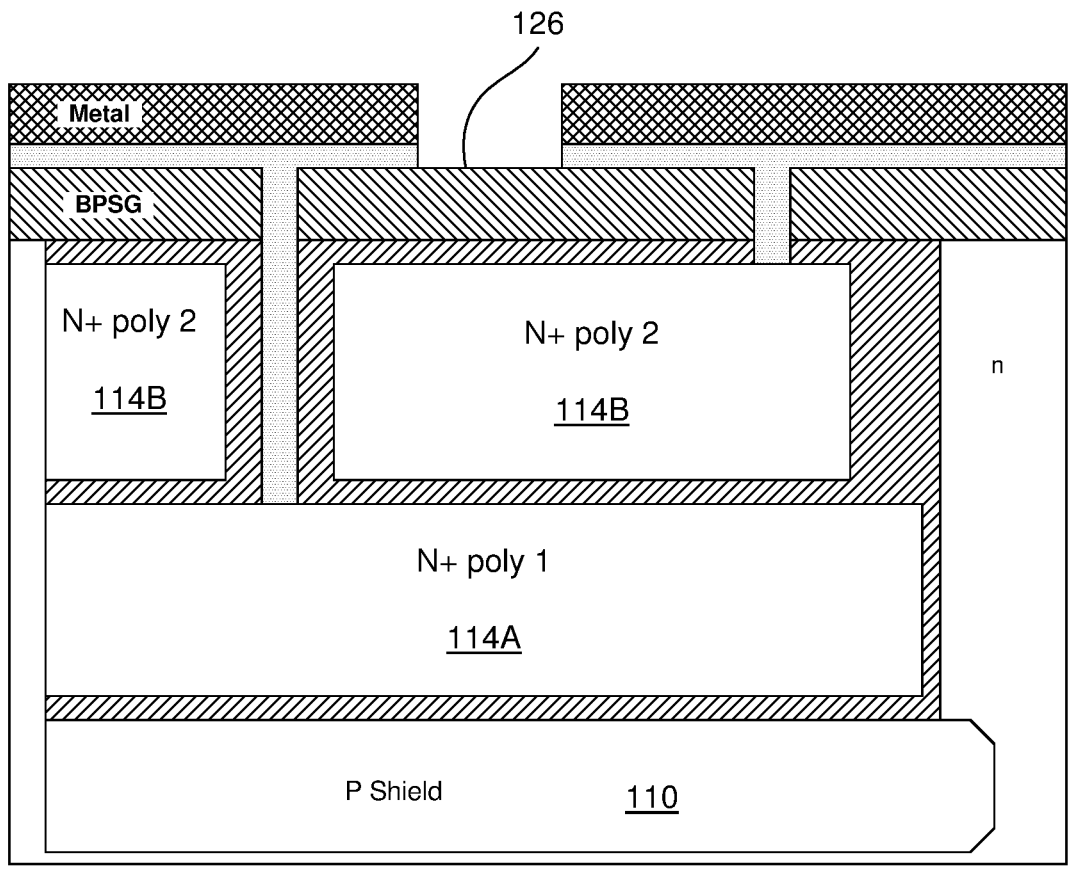
FIG. 3V illustrate cross section of the trench ends and poly connection contacts after metal mask.

FIG. 3V shows another structure, after the metal mask processing, including a cross section of the trench ends and the first and second n+ poly layer connection contacts.

Figure 3W:
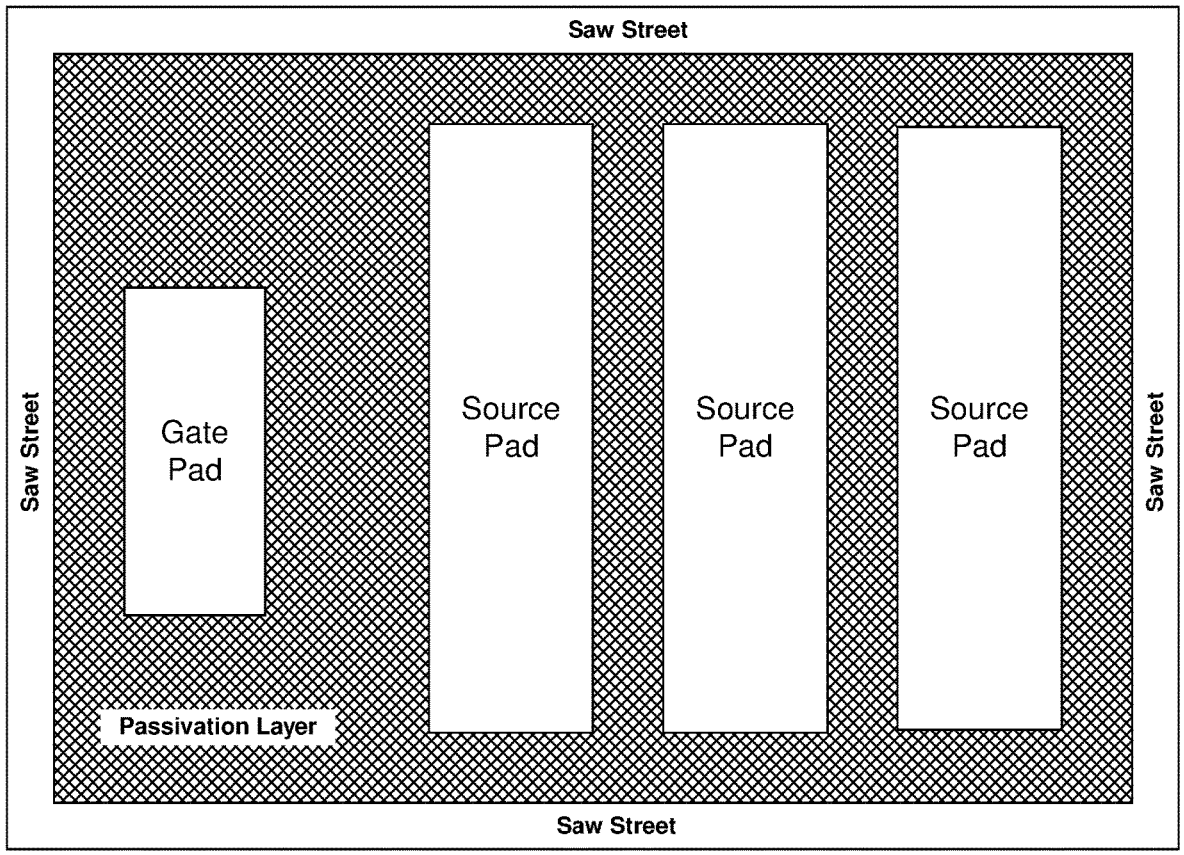
FIG. 3W illustrate complete device in top view with mask 8 which is passivation mask.

FIG. 3W shows processing with M8 mask or passivation mask in a top view of a completed device (trench MOSFET).

Figure 4A:
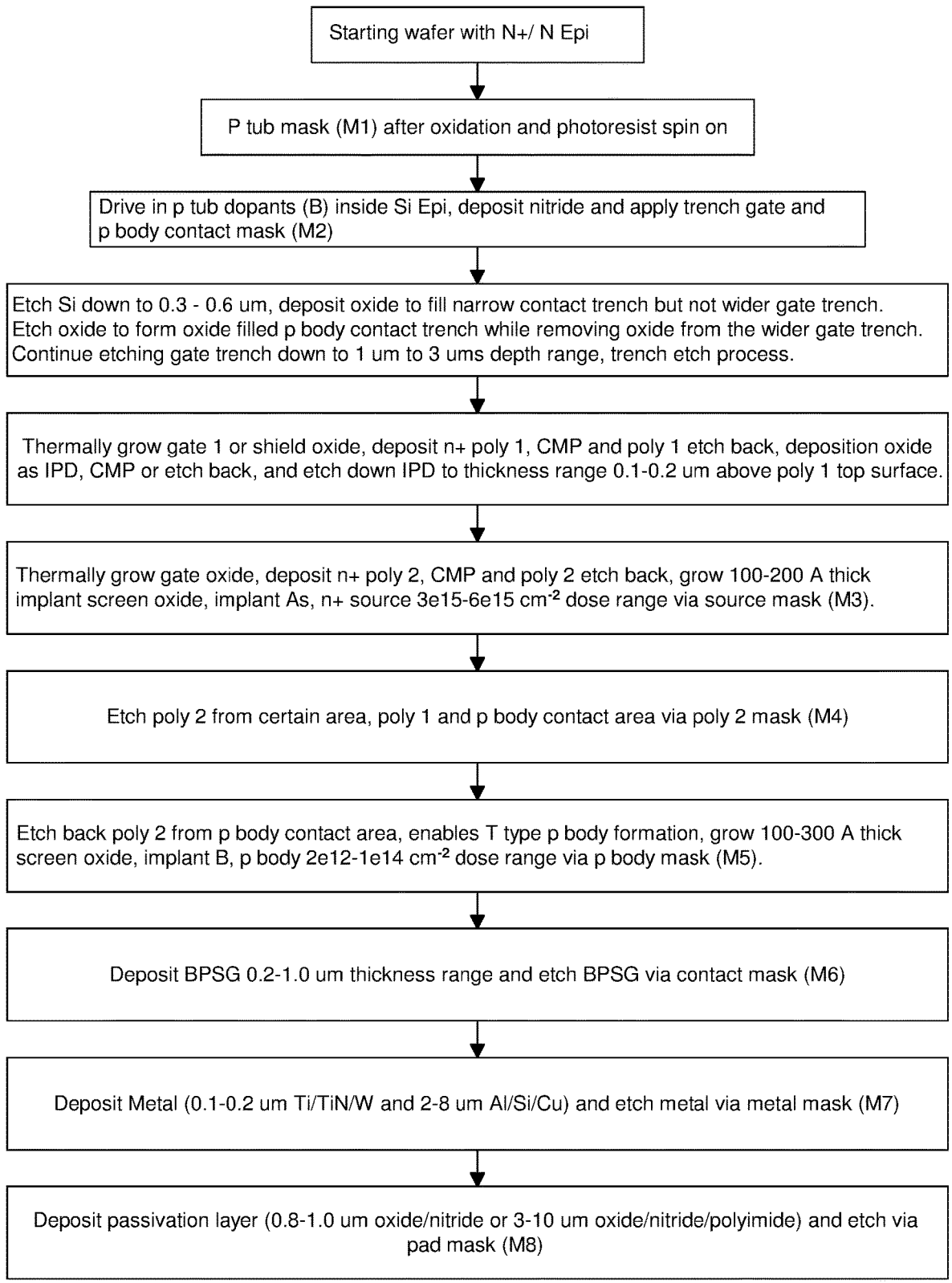
FIG. 4A is a flow chart showing a process embodiment for the structure shown FIG. 1G.

FIG. 4A is a flow chart showing the major steps of the process flow for double poly silicon involved process including the etching of the second poly silicon and forming T-shape p body region as shown in FIG. 1G. Process flow for forming the active cell structure shown in FIG. 1G may include firstly replacing IPD mask with the second n+ poly layer etch mask; and secondly a photolithographic process, shown in FIGS. 4B-4K and described below, including: Mask-1 (M1) for forming the p tub, Mask-2 (M2) for forming the gate and contact trenches and the second n+ poly layer etching, Mask-3 (M3) for forming n+ source regions next to contact trenches, Mask-4 (M4) for etching the second n+ poly layer, Mask-5 (M5) for forming p body regions, Mask-6 (M6) for forming contacts, Mask-7 (M7) for forming the metal layer, and Mask-8 (M8) for forming the passivation layer.

Figure 4B:
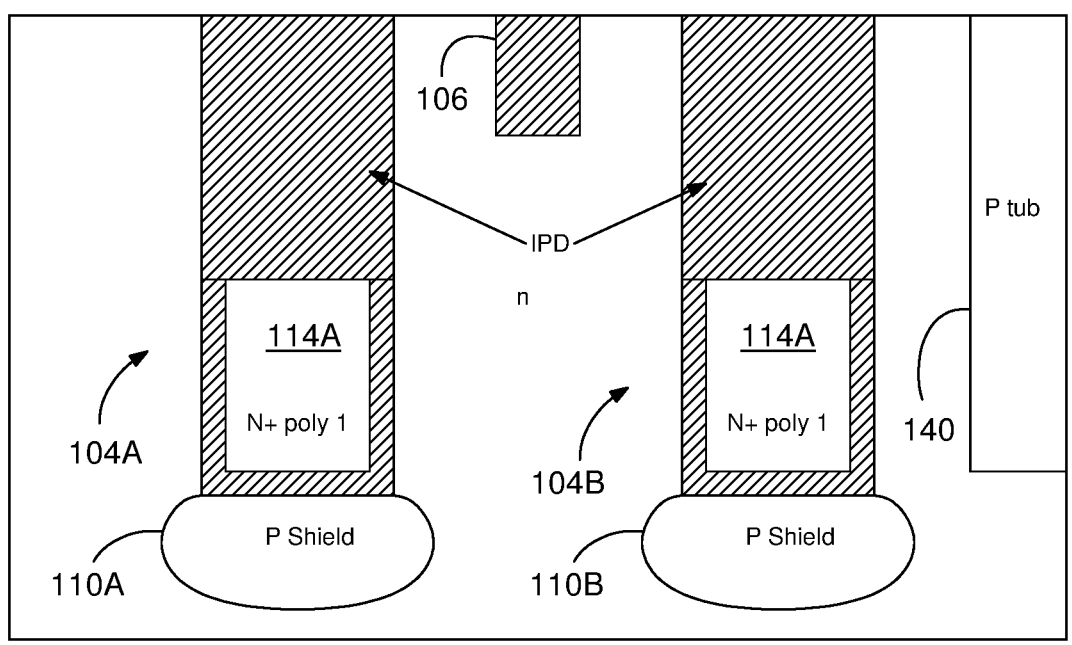
FIG. 4B illustrates after inter poly dielectric (IPD) planarization process which follows the process steps shown in FIGS. 3B-3E.

FIG. 4B shows the structure after IPD layer fill over the first n+ poly layer 114A in the gate trenches 104A. 104B and CMP planarizing of IPD. Prior M1 mask and M2 mask steps are the same as previously discussed steps shown in FIGS. 3B-3D.

Figure 4C:
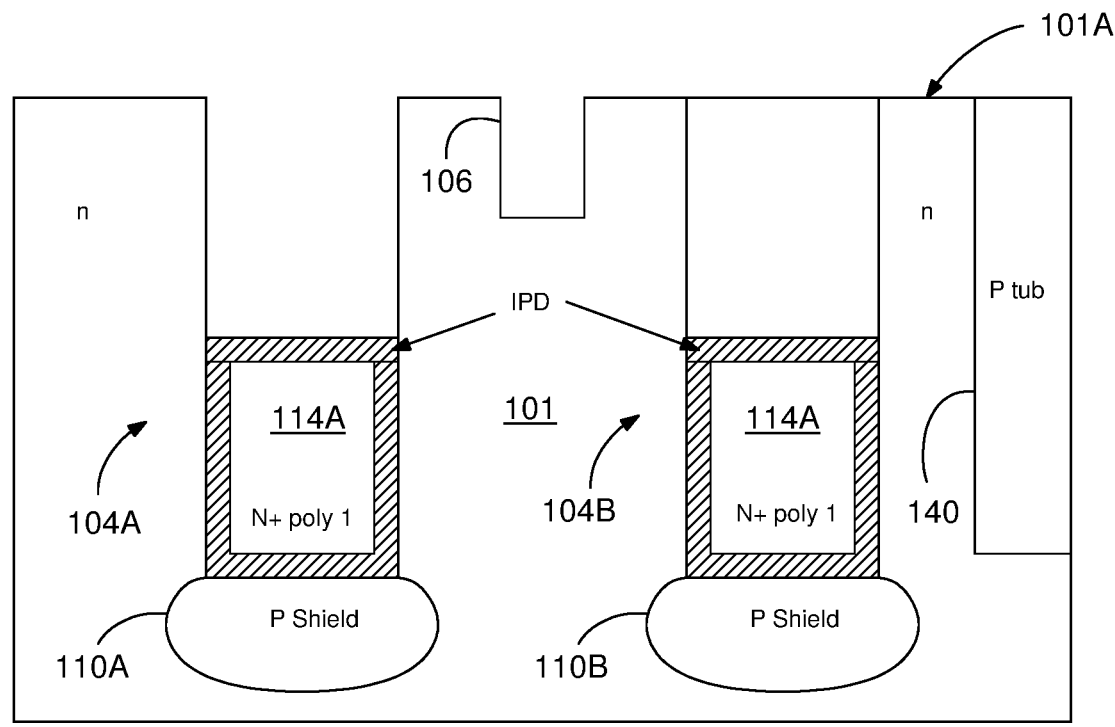
FIG. 4C illustrates use of Mask 2 for etching IPD.
Figure 4D:
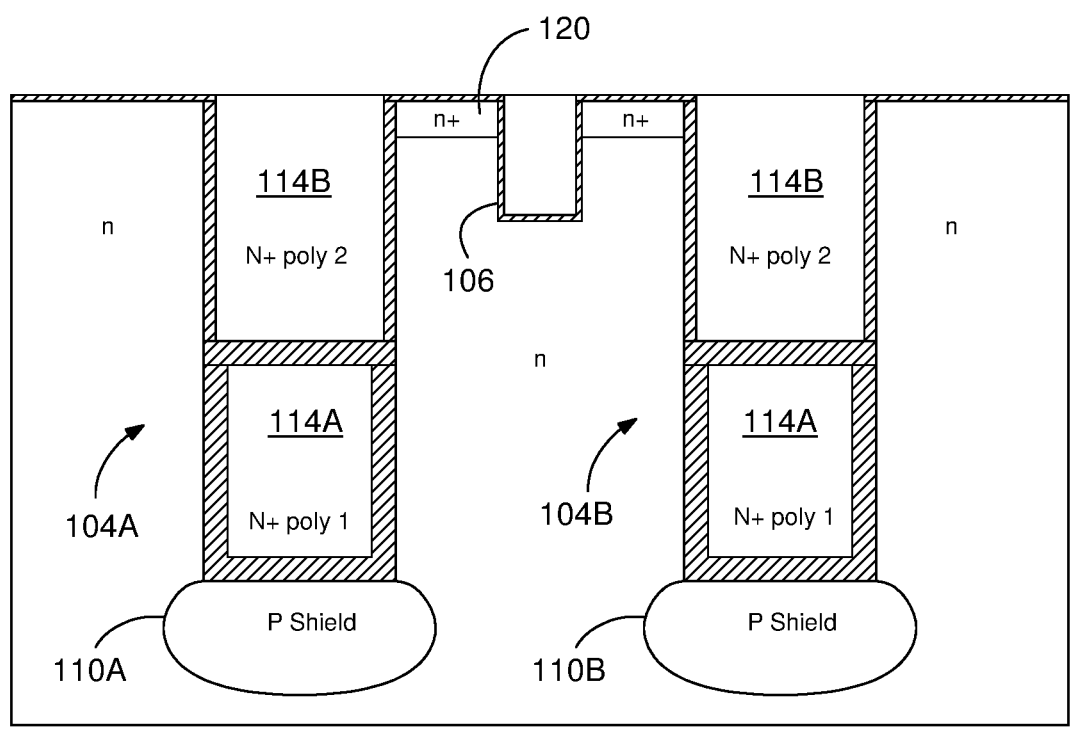
FIG. 4D illustrates use of Mask 3 for forming n+ source.

FIG. 4C shows the structure after the IPD etched down to targeted thickness in the 0.1-0.3 μm range without any masking steps to form the IPD insulation layer over the first n+ poly silicon layer 114A. During the process, the oxide and nitride layers may be etched off after etching of the IPD in the gate trenches 104. After the IPD insulation layer is formed, a shield oxide from 0.1-0.4 μm thickness range may be formed on the side walls of the gate trenches, by growing on and or depositing inside the gate trenches 104. This is followed by the deposition of a layer of the second n+ poly layer 114B over the shield oxide, and the second n+ poly is planarized using CMP or etched down. After the second planarization and removal of the surface oxide, an implant screen oxide grown or deposited in a thickness range of 100 to 200 Å on the front surface 101A of the silicon layer 101 and As ions as n+ source ion implanted via n+ source mask to form n+ source regions 120 with M3 mask, as shown in FIG. 4D.

Figure 4E:
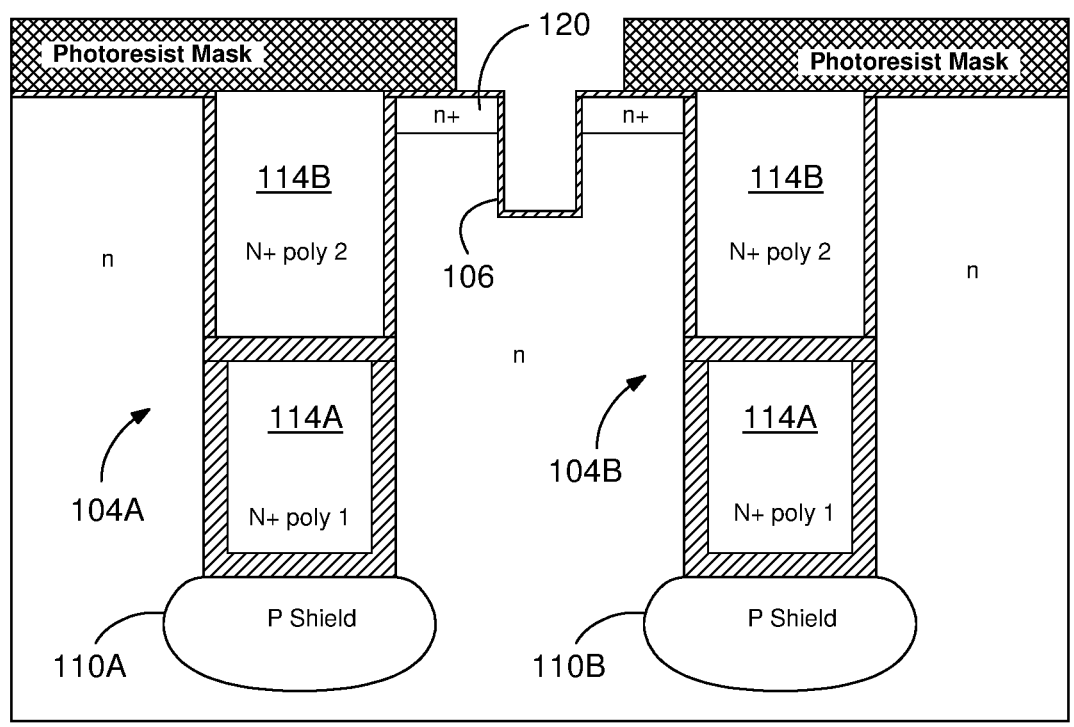
FIGS. 4E-4F illustrate use of Mask 4 which is poly 2 mask.
Figure 4F:
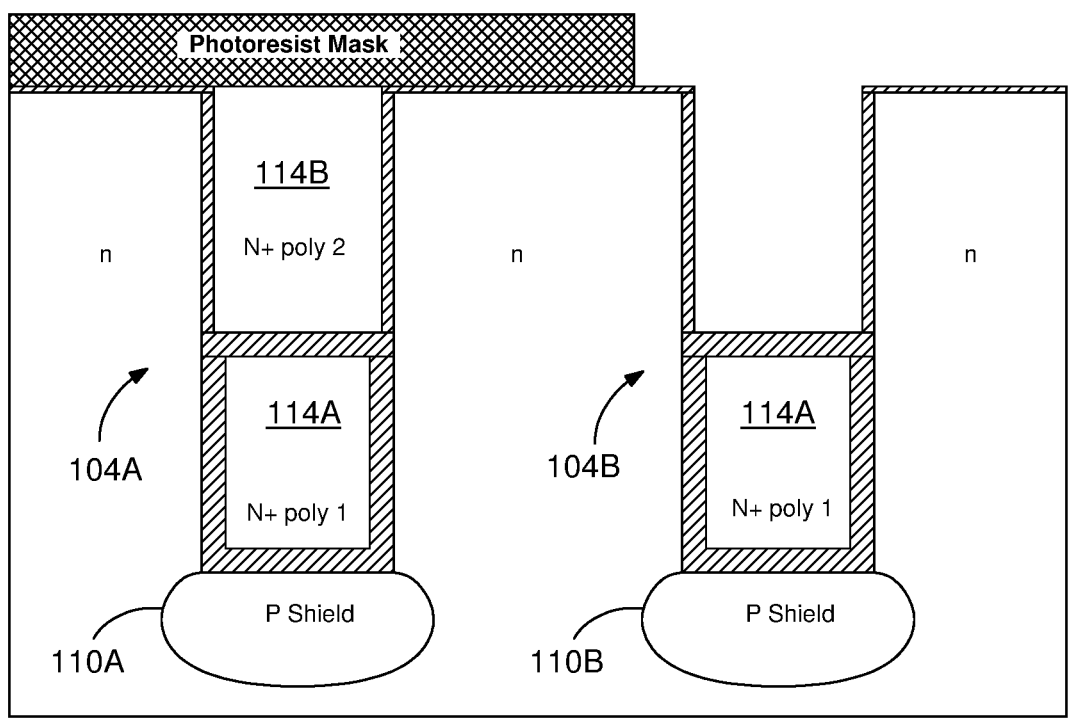

FIG. 4E and FIG. 4F show the different regions of the device after using poly 2 mask, M4 mask, to remove or etch off the second n+ poly silicon layer 114B from the poly 1 access/contact regions and p+ body trench regions.

Figure 4G:
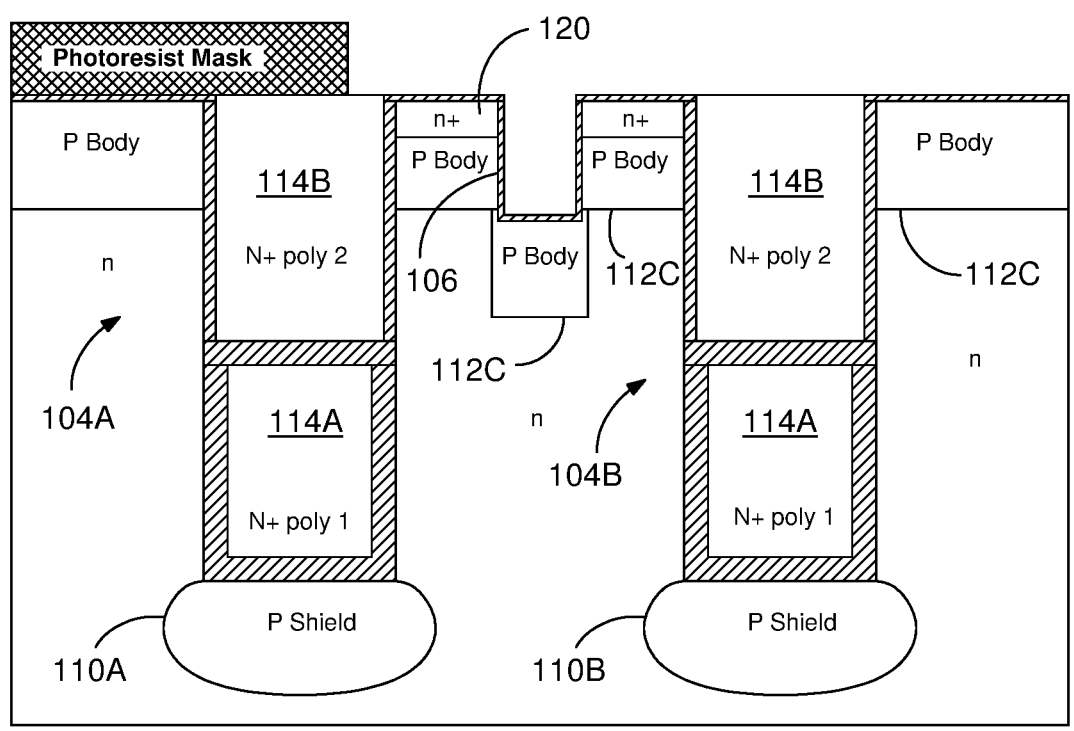
FIGS. 4G-4K illustrate use of Mask 5 which is p body mask.
Figure 4H:
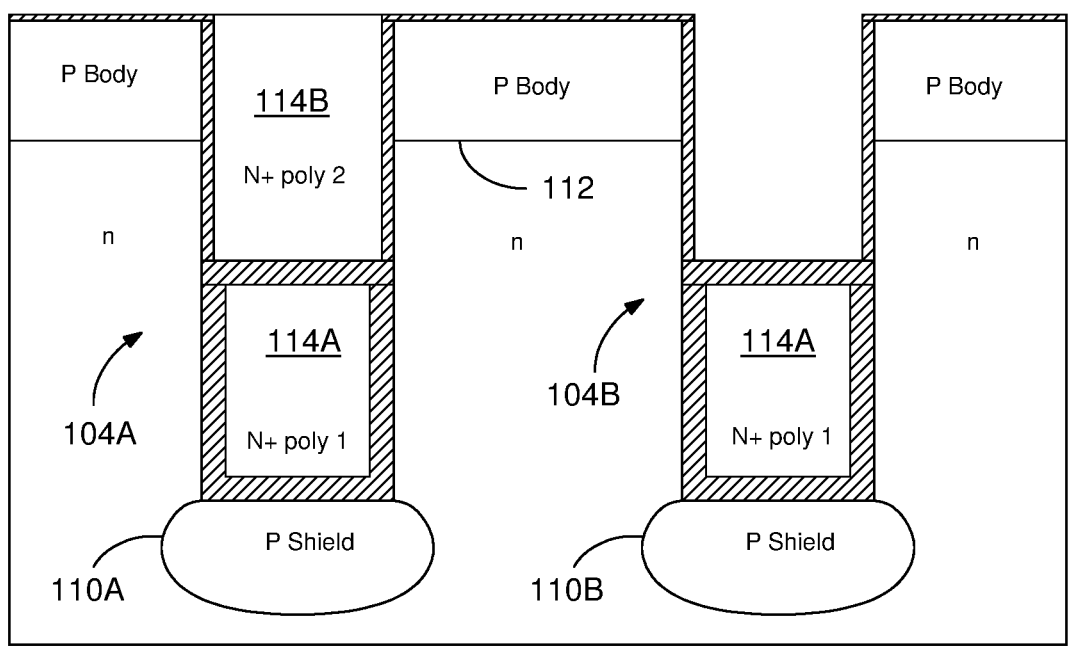
Figure 4I:
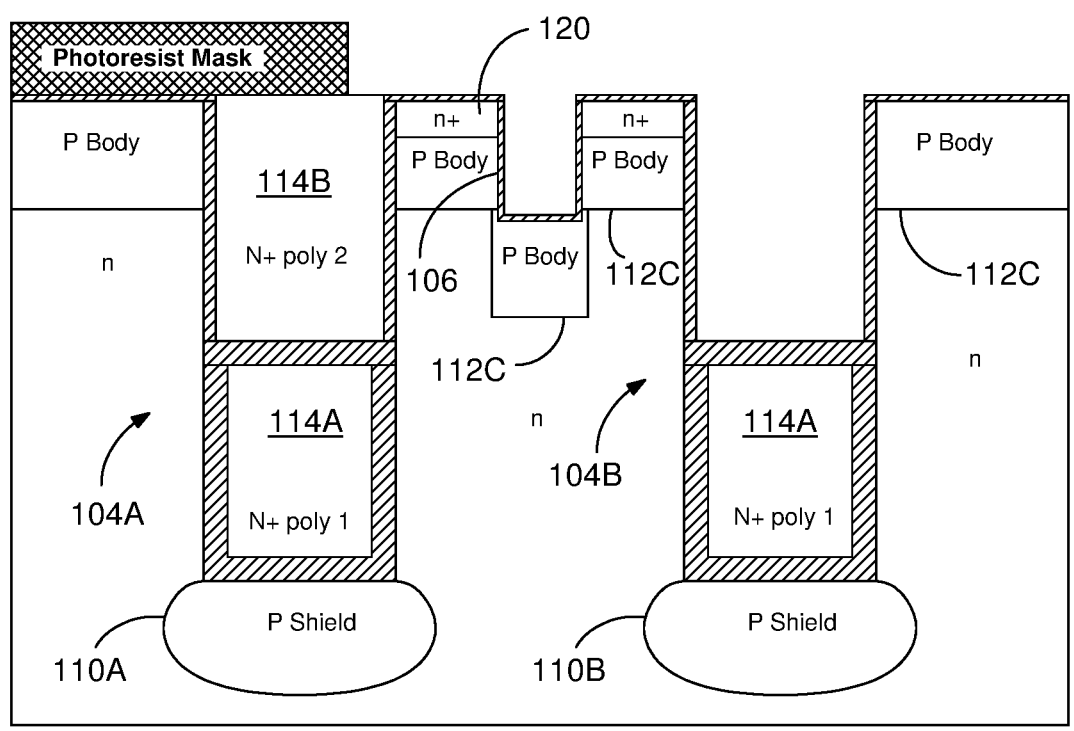

FIG. 4G, FIG. 4H and FIG. 4I show cross sections of different regions of the device after processing with M5 mask to from p body region 112C in the active cell, poly 1 and poly 2 contact regions. After the n+ source implant process, poly 2 is removed from p+ body regions 112D (FIG. 1G) and the certain other portions of the device, the wafer may be cleaned and deposited or grown an ion implant screen oxide on the silicon including trench and p+ body regions followed by B ion implantation via a p body mask, M5 mask. This process step forms T-shape p body.

Figure 4J:
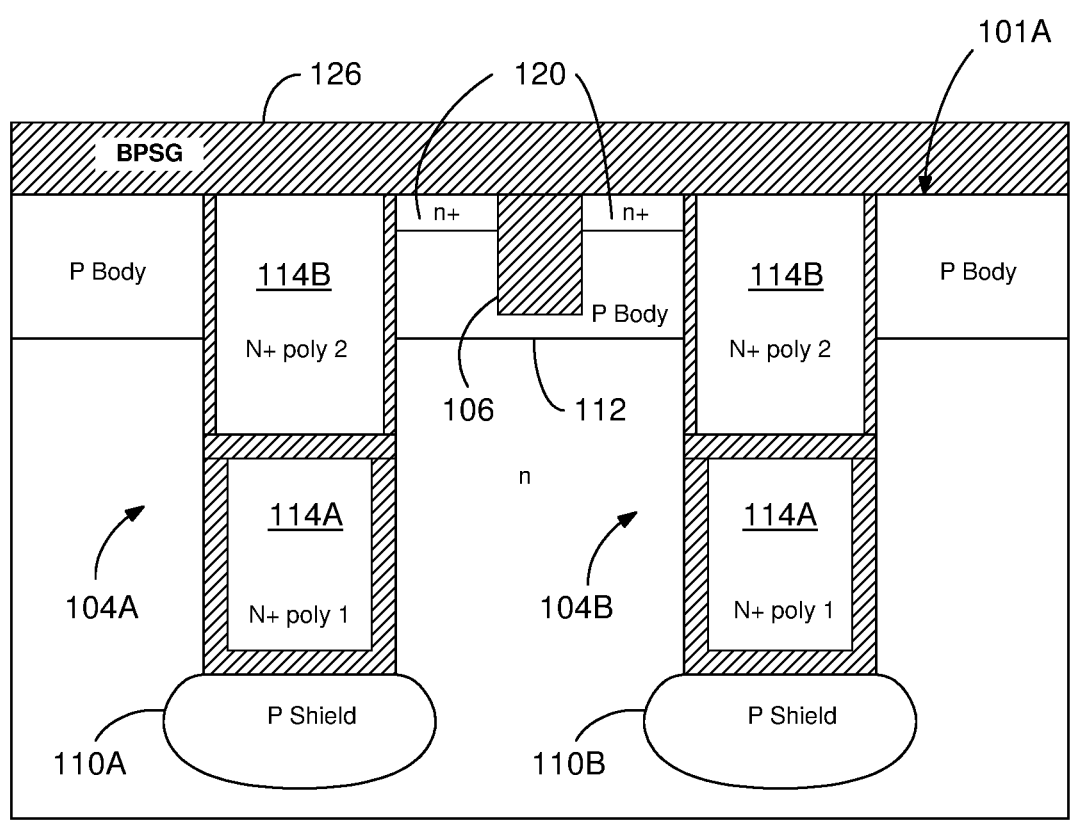
Figure 4K:
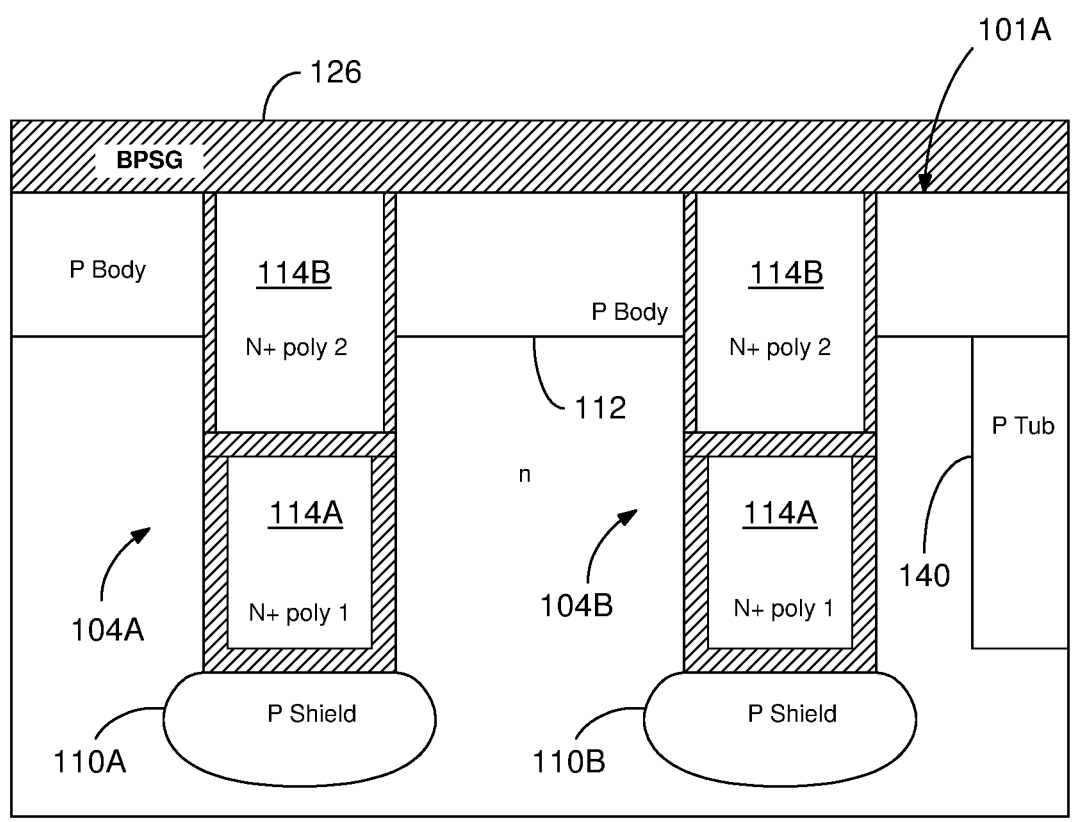

FIG. 4J and FIG. 4K show cross sections of the different regions of the device after going through BPSG deposition process steps. After p body masking and processing, a BPSG layer from 0.2-0.6 μm thickness range may be deposited over the silicon surface 101A to fill all the trenches 104A, 104B, and 106.

Figure 4L:
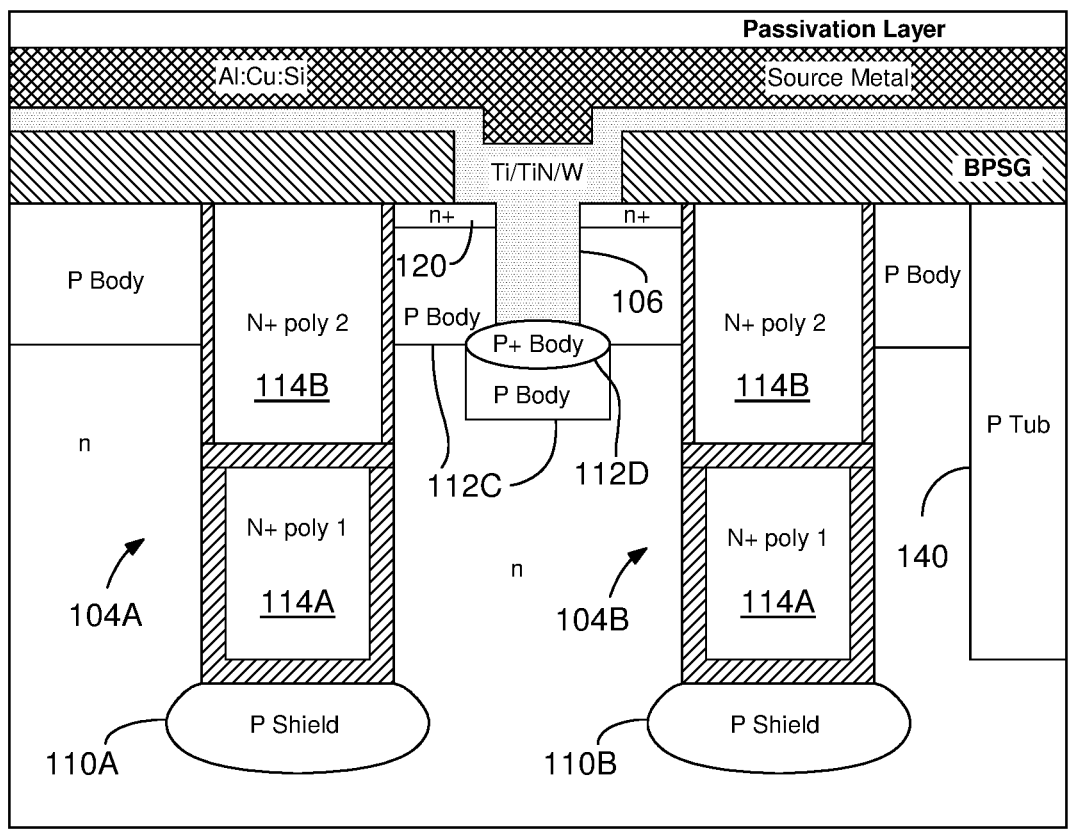
FIG. 4L illustrate final structure with poly 2 etch process.

FIG. 4L shows the structure after contact masking, M6 mask, removing BPSG from the all contact areas including p+ body trench contacts and B or $BF_2$ ions implanted into p+ contact trenches followed by Ti/Ni/W buffer metal and Al:Si:Cu thick metal deposition. The process will be completed after metal etching via metal mask, M7 mask, and then passivation layer deposition and etching the pad areas via pad mask, M8 mask and wafer backside processing. This is also shown in FIG. 1G.

A process flow for the structure shown in FIG. 1H may have only 7 masking steps including for example: M1 mask for forming gate and contact trench etch, poly 2 CMP planarization; M2 mask for forming n+ source; M3 mask for etching poly 2; M4 mask for forming p body; M5 mask for forming contacts; M6 mask for forming metal layer; and, M7 mask for forming passivation layer.

Figure 5:
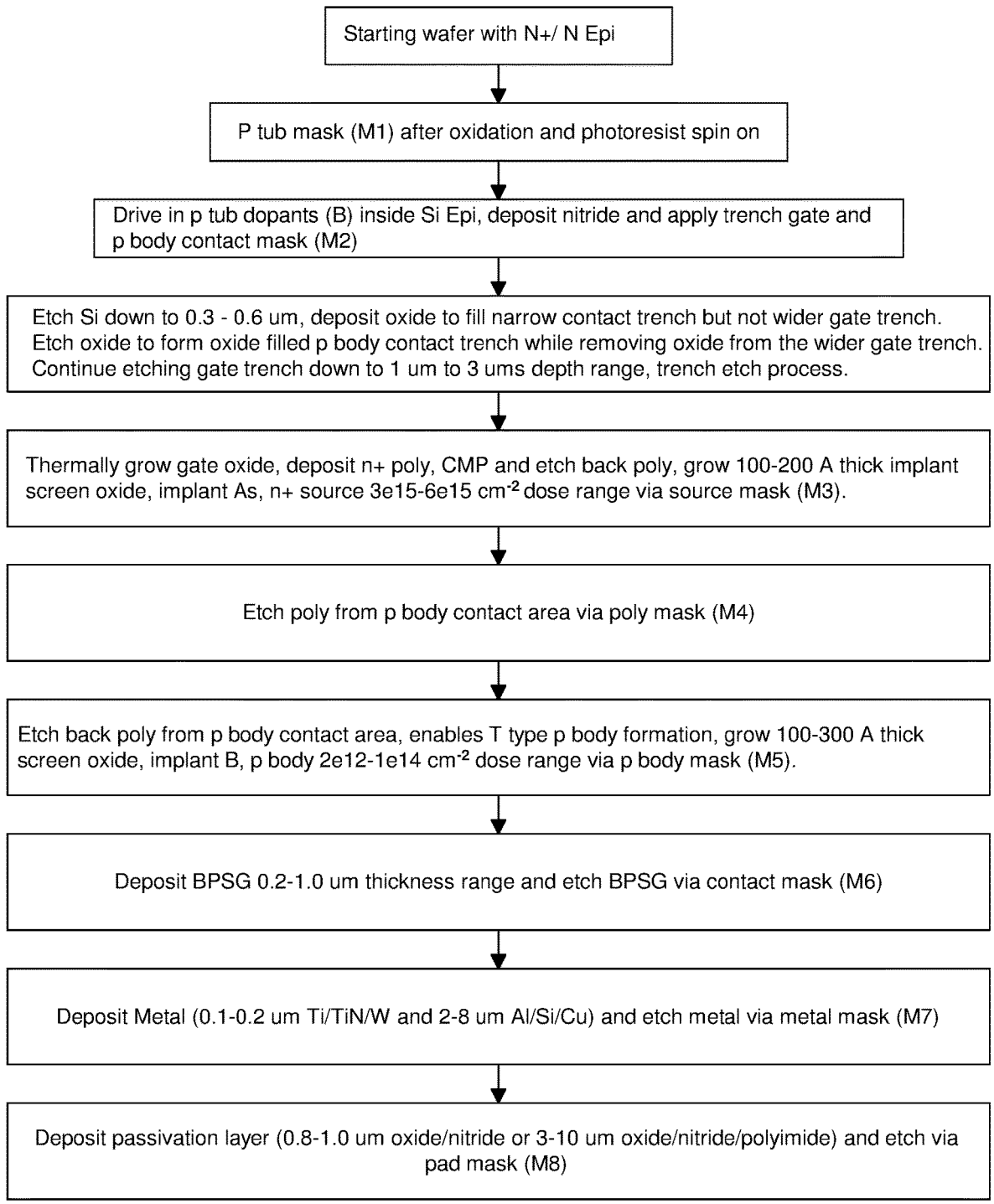
FIG. 5 is a flow chart showing a process embodiment for the structures shown in FIGS. 2A-2B.

FIG. 5 shows a process flow for forming the structures shown in FIG. 2A which may include 8 mask steps including: M1 mask for forming p tub; M2 mask for forming gate and contact trench, poly CMP planarization after n+ poly silicon deposition; M3 mask for forming n+ source; M4 mask for etching poly; M5 for forming p body M6 mask for forming contacts; M7 mask for forming metal layer; and, M8 mask for forming passivation layer.

Referring back to FIG. 5, a process embodiment including the single poly structure shown in FIG. 2A may include the steps of: After p tub and trench, and p+ contact etch mask, high energy B ions implanted to form p shield; a gate oxide may be grown and an n+ poly Si may be deposited (FIG. 2A); CMP planarization of poly Si; implanting As ions to form n+ source regions; applying a poly Si etch mask to remove the n+ poly Si from certain regions of the MOSFET device, such as edge or high voltage termination regions and from the p+ contact window at the middle of the each active trench MOSFET cells; depositing BPSG and reflowing it and also applying a contact mask; if no Schottky diode is formed, low energy B ion implanting for p+ contact region formation for the p body region; if Schottky diode is formed, after contact mask, implanting low dose B ions to form n− region to adjust Schottky diode barrier height, and then using an additional p+ implant block mask to protect p+ formation in the regions reserved for Schottky diode; after the p+ block or contact masking, depositing metal system; applying metal mask; and, depositing passivation film and then applying passivation mask to open pad areas and saw street. This process embodiment closely follows double poly Si process flow as shown in FIGS. 4B-4L.

A process embodiment including single poly structure shown in FIG. 2B may include the steps of: starting with trench mask and Si etching; growing gate oxide and depositing n+ poly Si; CMP planarizing poly Si; implanting As ions to form n+ source; applying poly Si etch mask to remove poly from certain regions of the MOSFET device such as edge or high voltage termination regions and from the p+ contact window at the middle of the each active trench MOSFET cells; implanting B ions via p body mask and depositing BPSG and reflowing it and also applying a contact mask; if no Schottky diode is formed, low energy B ion implanted for p+ contact region formation for the p body region; if Schottky diode is formed, after the contact mask, implanting low dose of B ions to form n− region to adjust Schottky diode barrier height, and then using an additional p+ implant block mask to protect p+ formation in the regions reserved for Schottky diode; after p+ block or contact masking, depositing metal system; Applying a metal mask; and depositing passivation film and then applying passivation mask to open pad areas and the saw street.

An exemplary process flow to form structures shown in FIGS. 1A-1F on the wafer may include applying a double poly Si process and applying a manufacturing process using multiple masks. The process flow may include applying mask 1 for forming a p tub, applying mask 2 for forming gate and contact trenches, applying mask 3 for forming IPD (inter poly dielectric) layer, applying mask 4 for forming a p body region, applying mask 5 for forming an n+ source, applying mask 6 for forming contacts, applying mask 7 for forming the metal, and applying mask 8 for forming a passivation layer over the metal (optional for 30V and below MOSFETs). The gate trench is a MOS gate trench and the contact trench is a self-aligned p+ body contact trench. P type dopant implanted shield region may be formed under each MOS gate trench.

Another exemplary process flow for forming a structure shown in FIG. 1G, on the wafer, may include applying a double poly Si process using inter poly dielectric (IPD) and applying a manufacturing process using multiple masks. The manufacturing process may include applying mask 1 for forming a p tub, applying mask 2 for forming MOS gate and contact trenches, and planarize poly 2 using CMP, applying mask 3 for forming n+ source regions, applying mask 4 for etching poly 2, applying mask 5 for forming p body, applying mask 6 for forming contacts, applying mask 7 for forming the metal, and applying mask 8 for forming the passivation layer. The gate trench is a MOS gate trench and the contact trench is a self-aligned p+ contact trench formed inside a T-shaped p body region. P type dopant implanted shield regions may be formed under each MOS gate trench.

Another exemplary process flow for forming a structures shown in FIG. 2A may include applying a manufacturing process using multiple masks, the manufacturing process including the steps of: applying mask 1 for forming p tub, applying mask 2 for forming MOS gate and contact trenches, and planarizing poly using CMP after n+ poly Si deposition, applying mask 3 for forming n+ source, applying mask 4 for etching poly, applying mask 5 for forming a p body region, applying mask 6 for forming contacts, applying mask 7 for forming the metal, and applying mask 8 for forming the passivation layer. The gate trench is a MOS gate trench and the contact trench is a self-aligned contact trench formed inside T-shaped p body region. P type dopant implanted shield regions are formed under each MOS gate trench.

Another exemplary process for forming a MOSFET device, including a single poly structure, may include starting the process with a trench mask and etching the silicon wafer using mask 1, growing a gate oxide and depositing a layer of n+ poly Si, planarizing the n+ poly Si using CMP, implanting As ions to form n+ source regions using mask 2, applying poly Si etch mask to remove poly Si from certain regions of the MOSFET device such as edge or high voltage termination regions and from the p+ contact window at the middle of the each active trench MOSFET cell, applying p body implant via mask 3, depositing BPSG and reflowing it and also applying contact mask 5, implanting low energy B ions for p+ contact region formation for the P body region if no Schottky diode is formed, implanting low dose B ions to form n-region, after contact mask, to adjust Schottky diode barrier height then use an additional p+ implant block mask to protect p+ formation in the regions reserved for Schottky diode, if Schottky diode is formed, depositing metal system after p+ implant block or contact mask, applying metal mask using mask 6, and depositing passivation film and then applying passivation mask to open pad areas and saw street using mask 7.

Although aspects and advantages of the present invention are described herein with respect to certain embodiments, modifications of the embodiments will be apparent to those skilled in the art. Thus, the scope of the present invention should not be limited to the foregoing discussion, but should be defined by the appended claims.

I claim:

1. A MOSFET device, comprising:
a semiconductor layer having a first type conductivity overlying a semiconductor substrate, the semiconductor layer having a front surface;
an array of a plurality gate trenches and contact trenches formed in an alternating fashion disposed in an active region of the front surface extending orthogonally from the front surface toward the semiconductor substrate, each gate trench defining a first depth and a first width and each contact trench defining a second depth and a second width, and wherein the first depth and the first width are greater than the second depth and the second width, respectively,
wherein each gate trench includes a conductive structure of the first type conductivity, the conductive structure in each gate trench being insulated by an insulation layer, and wherein each contact trench is formed within a first doped contact region, having a second type conductivity, extending between the adjacent gate trenches and includes a contact structure connected to a source electrode, wherein the depth of the first doped contact region is less than the first depth and greater than the second depth;
a second doped contact region of the second type conductivity located at least partially within the first doped contact region and under each contact trench, the second doped contact region being in electrical contact with the source electrode via the contact structure in the contact trench, wherein the second doped contact region has a higher second type dopant concentration than the first doped contact region, and wherein the second doped contact region is located equal distance away from the gate trenches located at both sides of the second contact region; and
a shield region of the second type conductivity located under each gate trench and vertically separated from the first doped contact region.

2. The MOSFET device of claim 1, wherein the first contact region and the shield region electrically connected to the source electrode via a tub region of the second type conductivity.

3. The MOSFET device of claim 1, wherein the conductive structure includes a first conductive structure and a second conductive structure, wherein the first conductive structure is insulated from the second conductive structure by a dielectric layer.

4. The MOSFET device of claim 1 further including a third doped contact region of the first type conductivity located in the first doped contact region and adjacent the front surface, the third contact region being in contact with the contact structure in the contact trench.

5. The MOSFET device of claim 1, wherein the conductive structure in the gate trenches is n+ poly silicon.

6. The MOSFET device of claim 1, wherein the front surface is coated with a dielectric layer.

7. The MOSFET device of claim 1, wherein the contact structures in the contact trenches are an integral part of a conductive buffer layer on the dielectric layer.

8. The MOSFET device of claim 7, wherein the source electrode is located on the conductive buffer layer.

9. The MOSFET device of claim 8, wherein the source electrode includes one of a layer of Al:Cu:Si, a layer of Al:Si, and a layer of Al:Cu.

10. The MOSFET device of claim 1, wherein the conductive buffer layer on the dielectric layer includes a layer of Ti/TiN/W.

11. A MOSFET device, comprising:
- a semiconductor layer having a first type conductivity overlying a semiconductor substrate, the semiconductor layer having a front surface;
- an array of plurality of MOS gate trenches and contact trenches formed in an alternating fashion disposed in an active region of the front surface extending orthogonally from the front surface toward the semiconductor substrate, wherein each MOS gate trench defining a first depth and a first width and each contact trench defining a second depth and a second width, and wherein the first depth and the first width are greater than the second depth and the second width, respectively;
- a first doped contact region, having a second type of conductivity, extending between the MOS gate trenches of the array, each contact trench being disposed within the first doped contact region, wherein the first doped contact region has a T-shape including a horizontal section extending parallel to the front surface and a vertical section extending orthogonally from a central part of the horizontal section, wherein the depth of the first doped contact region is less than the first depth and greater than the second depth;
- wherein each MOS gate trench includes a conductive structure of the first type conductivity, the conductive structure in the MOS gate trench being insulated by an insulation layer, and wherein each contact trench includes a contact structure connected to a source electrode; and
- a second doped contact region of the second type conductivity located within the first doped contact region and under the contact trench, a first portion of the second contact region being in the horizontal section of the first doped contact region and a second portion of the second contact region being in the vertical section of the first doped contact region, wherein the second doped contact region is in electrical contact with the source electrode via the contact structure in the contact trench, and wherein the second doped contact region has a higher second type dopant concentration than the first doped contact region, and wherein the second doped contact region is located equal distance away from the MOS gate trenches located at both sides of the second contact region.

12. The MOSFET device of claim 11 further including a shield region of the second type conductivity located under each MOS gate trench and vertically separated from the first doped contact region.

13. The MOSFET device of claim 12, wherein the first contact region and the shield region electrically connected to the source electrode via a tub region of the second type conductivity.

14. The MOSFET device of claim 11, wherein the conductive structure includes a first conductive structure and a second conductive structure, wherein the first conductive structure is insulated from the second conductive structure by a dielectric layer.

15. The MOSFET device of claim 11 further including a third doped contact region of the first type conductivity located in the first doped contact region and adjacent the front surface, the third contact region being in contact with the contact structure in the contact trench.

16. The MOSFET device of claim 11, wherein the conductive structure in the MOS gate trenches is n+ poly silicon.

17. The MOSFET device of claim 11, wherein the front surface is coated with a dielectric layer.

18. The MOSFET device of claim 11, wherein the contact structures in the contact trenches are an integral part of a conductive buffer layer on the dielectric layer.

19. The MOSFET device of claim 18, wherein the source electrode is located on the conductive buffer layer.

20. The MOSFET device of claim 19, wherein the source electrode includes one of a layer of Al:Cu:Si, a layer of Al:Si, and a layer of Al:Cu.

21. The MOSFET device of claim 11, wherein the conductive buffer layer on the dielectric layer includes a layer of Ti/TiN/W.

* * * * *